(12) United States Patent
Urakawa

(10) Patent No.: US 7,292,119 B2
(45) Date of Patent: Nov. 6, 2007

(54) PHASE LOCKED LOOP FREQUENCY SYNTHESIZER

(75) Inventor: Tatsuya Urakawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 79 days.

(21) Appl. No.: 11/087,586

(22) Filed: Mar. 24, 2005

(65) Prior Publication Data
US 2005/0219003 A1    Oct. 6, 2005

(30) Foreign Application Priority Data
Mar. 31, 2004    (JP)    ............................ 2004-108268

(51) Int. Cl.
*H03B 5/12*    (2006.01)
(52) U.S. Cl. .......................... 331/179; 331/11; 331/16; 331/44; 331/117 R
(58) Field of Classification Search ................ 331/179, 331/16, 44, 11, 117 R
See application file for complete search history.

(56) References Cited

U.S. PATENT DOCUMENTS

| 6,563,387 | B2 | 5/2003 | Hirano et al. | |
|---|---|---|---|---|
| 7,012,470 | B2 * | 3/2006 | Suzuki et al. .................. | 331/16 |
| 7,103,337 | B2 * | 9/2006 | Uozumi et al. ............. | 455/255 |
| 7,146,143 | B2 * | 12/2006 | Oosawa et al. .......... | 455/245.1 |
| 2003/0048139 | A1 | 3/2003 | Chien et al. | |
| 2003/0224749 | A1 | 12/2003 | Uozumi et al. | |

(Continued)

FOREIGN PATENT DOCUMENTS

EP    0 844 738 A    5/1998

(Continued)

OTHER PUBLICATIONS

Korean Office Action dated Jun. 30, 2006.

*Primary Examiner*—Benny Lee
*Assistant Examiner*—Levi Gannon
(74) *Attorney, Agent, or Firm*—McGinn IP Law Group, PLLC

(57) ABSTRACT

The phase locked loop frequency synthesizer, includes: an LC-tank circuit which includes an inductor and a variable capacitor in which the capacity changes depending on the input voltage; a group of fixed-value capacitors which is connected to the LC-tank circuit in parallel; a voltage control oscillating unit which outputs a signal with a frequency determined by the LC-tank circuit and the group of fixed-value capacitors; a phase control unit which generates an output current based on an error operator between a first signal with a divided frequency of a reference frequency and a second signal with a divided frequency of the frequency output from the voltage control oscillating unit; a fixed-value capacitor controlling unit which outputs a selection signal which determines the combination of the fixed-value capacitors to be connected to the LC-tank circuit in parallel based on a frequency dividing ratio setting signal including information about dividing ratio of the second signal, and controls the connection of the fixed-value capacitors selected from the group of fixed-value capacitors based on the selection signal to the LC-tank circuit in parallel; and a variable capacitor controlling unit which selects either one of a fixed bias voltage and the voltage obtained by converting the output current output from the phase control unit and inputs the selected voltage to the variable capacitor of the LC-tank circuit.

18 Claims, 14 Drawing Sheets

U.S. PATENT DOCUMENTS

2005/0068119 A1* 3/2005 Uozumi et al. ............. 331/179
2005/0083137 A1* 4/2005 Lee et al. ..................... 331/16

FOREIGN PATENT DOCUMENTS

| | | |
|---|---|---|
| JP | 2001-339301 | 12/2001 |
| JP | 2003-152535 | 5/2003 |
| JP | 2003-264461 | 9/2003 |
| JP | 2003-318732 | 11/2003 |
| JP | 2004-007433 | 1/2004 |

* cited by examiner

PHASE LOCKED LOOP FREQUENCY SYNTHESIZER

This application is based on Japanese Patent application No. 2004-108268, the content of which is incorporated hereinto by reference.

BACKGROUND OF THE INVENTION

1. Field of the Invention

The present invention relates to a PLL frequency synthesizer including a voltage controlled oscillator and a phase control loop which controls the oscillation frequency of the voltage controlled oscillator, integrated on a semiconductor device, and a method of automatically selecting the oscillation frequency of a voltage controlled oscillator.

2. Description of the Related Art

In various wireless communication systems, frequencies in receiving signals and transmitting signals vary in accordance with the communication systems. A PLL frequency synthesizer including an oscillator and a phase locked loop (PLL) is capable of determining the frequency accepted in the communication system.

FIG. 13 shows an example of a conventional PLL frequency synthesizer.

The conventional circuit includes a voltage controlled oscillator (VCO) 100, a phase locked loop unit (PLL unit) 200 and a low pass filter (LPF) 300.

The PLL unit 200 includes a buffer 201, a reference frequency divider (REF divider) 202, a buffer 203, a SIG frequency divider (SIG divider) 204, a phase comparator 205, and a charge pump 206. A reference signal having a reference frequency $f_{ref}$ is input to the REF divider 202 through the buffer 201. The REF divider 202 divides the input signal $f_{ref}$ by R to output a signal $f_{ref}/R$. The signal $f_{VCO}$ output from the VCO 100 is input to the SIG divider 204 through the buffer 203. The SIG divider 204 divides the input signal $f_{VCO}$ by N to output a signal $f_{VCO}/N$. The signal $f_{ref}/R$ and the signal $f_{VCO}/N$ are input to the phase comparator 205. The phase comparator 205 compares the input signals $f_{ref}/R$ and $f_{VCO}/N$ to output an output signal based on the frequency error of the signals $f_{ref}/R$ and $f_{VCO}/N$ to the charge pump 206. The charge pump 206 outputs an output signal Iout based on the error. The output signal Iout is converted to a voltage value, which becomes the voltage Vtune, by the LPF 300.

The VCO 100 generally includes a voltage-controlled oscillator. When the control voltage Vtune is input to the VCO 100, the VCO 100 outputs a signal having the oscillation frequency $f_{VCO}$, which is in turn input to the SIG divider 204 through the buffer 203, based on the input control voltage Vtune. Therefore, the VCO frequency $f_{VCO}$ is adjustable by controlling the control voltage Vtune.

Here, the PLL unit 200 generates the control current Iout such that the frequencies and the phases of the input signals, $f_{VCO}/N$ and $f_{ref}/R$ input to the phase comparator 205 become same. Therefore, the following frequency relationship can be obtained in a steady state "$f_{VCO}=N\times f_{ref}/R$".

The value of the dividing ratio N of the SIG-divider 204 is determined by a frequency dividing ratio setting signal externally input to the PLL unit 200. Therefore, an output signal having a desired frequency $f_{VCO}$ can be obtained by changing the frequency dividing ratio setting signal.

The VCO 100 and the PLL unit 200 shown in FIG. 13 are usually integrated on a semiconductor device. The semiconductor device includes a plurality of circuit elements such as transistors, resistors and condensers where those circuit elements are connected such that the semiconductor device realizes required circuit operations and functions.

Mainly, there are four requirements for the VCO 100 and the PLL unit 200, "high integration", "low noise", "high-speed responsibility" and "wider bandwidth".

"High integration" means that all circuits constructing the VCO and the PLL can be integrated on a semiconductor device. "Low noise" means that the noise components in the output signal VCO from the VCO 100 output in accordance with the input signal controlled by the PLL unit 200 can be decreased. This is determined by the output power ratio CN indicating output power of the carrier component to that of the noise component. "High-speed responsibility" means that the response time required for the output frequency to be stabilized to a desired value after the reference frequency is input to the VCO 100. "Wider bandwidth" means that the bandwidth of the VCO frequency $f_{VCO}$ of the VCO 100 is increased.

FIG. 14 shows another example of a conventional PLL frequency synthesizer.

The conventional PLL frequency synthesizer shown in FIG. 14 includes an oscillator unit (VCO unit) 110, a VCO selector 120, a phase controller (PLL unit) 200A and a low pass filter unit (LPF unit) 300.

The VCO unit 110 includes an LC oscillator. The LC oscillator includes an inductor (L) 111, a variable capacitance Cv and a negative mutual conductance (−G) 113 connected in parallel with each other. The output frequency of the VCO is determined by the resonance frequency of the inductor (L) 111 and the capacitor Cv. The LC oscillator oscillates at the resonance frequency with the function of the negative mutual conductance (−G) 113. In the VCO unit 110, the value of the variable capacitance Cv which includes a varactor diode continuously changes in accordance with the input control-voltage Vcnt, this in turn changes the resonance frequency of the LC resonance circuit. Thus, the VCO frequency $f_{VCO}$ of the VCO changes and therefore, it is possible to continuously change the output frequency $f_{VCO}$ of the VCO unit by the control voltage Vcnt.

Furthermore, the VCO unit 110 further includes m fixed-value capacitors C0, C1, C2, . . . , and Cm-1 connected to the variable capacitor 112 in parallel through the switches S0, S1, S2, . . . , and Sm-1, respectively. By selecting the switches S0, S1, S2, . . . , and Sm-1, the resonance frequency of the LC oscillator can be discretely changed and then the output frequency of the VCO unit 110 can be discretely adjustable.

FIG. 15 shows the relationship between the control voltage and the output frequency (Vcnt–$f_{VCO}$ characteristics) of the VCO unit 110 shown in FIG. 14. It is shown that the output frequency $f_{VCO}$ changes discretely by selecting the fixed value capacitors C0, C1, C2, . . . , and Cm-1 and continuously by the variable capacitance (CV) 112. Thus, broadband oscillation of the $f_{VCO}$ of the VCO unit 110 is realized by a combination of the discrete frequency change depending on the fixed-value capacitors C0, C1, C2, . . . , and Cm-1 and the continuous frequency change depending on the variable capacitance Cv.

Referring back to FIG. 14, the VCO-selector unit 120 controls on/off of the switches S0, S1, S2, . . . , and Sm-1 of the fixed-value capacitors C0, C1, C2, . . . , and Cm-1 of the VCO unit 110, respectively. The input signals to the VCO-selector unit 120 are a signal fCLK obtained by dividing the VCO frequency $f_{VCO}$ by the prescaler (PSC) 221 of the N-divider 220 and a signal ENCLK obtained by dividing the reference signal by the R-divider 210.

The signal fCLK is an operating clock of the counter 121. The active period of the counter 121 is determined by the signal ENCLK. The counter 121 counts up the signal fCLK during a period provided by the signal ENCLK. The count M' of the counter 121 is determined by the period provided by the signal ENCLK and the frequency fCLK. The count M' is then transferred to the calculation circuit 122.

The calculation circuit 122 calculates the count difference M−M', where M is the count corresponding to the required frequency and M' is the count of the counter 121, and compares the count difference M−M' with the predetermined convergence range ΔM.

In the case when M−M'<ΔM, the process for VCO selection is terminated. However, in the case when M−M'>ΔM, whether the VCO frequency $f_{VCO}$ is higher than the required frequency or lower is judged and the selection signal VCOSEL[m-1:0] is changed such that the VCO frequency $f_{VCO}$ approaches to the required frequency. With this, some of the control signals vcosel<0>, vcosel<1>, vcosel<2>, . . . , and vcosel<m-1> are generated though the decoder 123 to control the switches S0, S1, S2, . . . , and Sm-1 and determine the on/off of fixed-value capacitors C0, C1, C2, . . . , and Cm-1.

The PLL unit 200A includes a R-divider 210 which outputs the signal fr obtained by dividing the reference signal $f_{ref}$ by R, a N-divider 220 which outputs the signal fn obtained by dividing the VCO frequency $f_{VCO}$ of the VCO unit 110 by N, a phase comparator 230 which compares the phase of the signal fr with the signal fn, and a charge pump 240 which generates the output current Iout based on the phase error obtained by the phase comparison of the phase comparator 230. The output current Iout of the charge pump 240 is converted to the control voltage Vcnt through the LPF 300.

The N-divider 220 includes a prescaler (PSC) 221 and a N/A-counter 222. The PSC 221 receives the VCO frequency $f_{VCO}$ from the VCO unit 110, divides the VCO frequency $f_{VCO}$ by the constant value P, and generates a P-divided signal fpsc. The N/A-counter divides the P-divided signal fpsc by the constant value N', and generates a N-divided signal fn (=$f_{VCO}$/PN').

The operation of the PLL frequency synthesizer shown in FIG. 14 will be explained.

A. Discretely Adjusting Process for the VCO Frequency $F_{VCO}$

The discretely adjusting process can be obtained by controlling the VCO unit 110 by the VCO selector unit 120. The VCO selector unit 120 selects some of the fixed-value capacitors C0, C1, C2, . . . , and Cm-1 to be connected therewith with the control voltage Vcnt for the VCO unit 110 is kept at the constant voltage. At this time, the selection signal VCOSEL[m-1:0] is selected such that the VCO frequency $f_{VCO}$ approaches nearest to the required frequency. The phase comparator 230 and the charge pump 240 of the PLL unit 200A is not operated at this time. Further, the VCO frequency $f_{VCO}$ cannot be completely matched with the required frequency as the VCO frequency $f_{VCO}$ changes discretely.

B. Continuously Adjusting Process for the VCO Frequency $f_{VCO}$

The continuously adjusting process for the VCO frequency $f_{VCO}$ can be obtained by the selection signal CF[m-1:0] of the PLL unit 200A to the VCO unit 110. When the discretely adjusting process for the VCO frequency $f_{VCO}$ is completed, the selection signal VCOSEL[m-1:0] is fixed at the final result and the operation of the VCO selector unit 120 is terminated. Then, the control voltage Vcnt to the VCO unit 110 is released from the previous fixed voltage. Then, the operation of the phase comparator 230 and the charge pump 240 of the PLL unit 200A is started. Hence, the control voltage Vcnt is controlled by the PLL unit 200A, so that the VCO frequency $f_{VCO}$ changes continuously. Since the VCO frequency $f_{VCO}$ continuously changes in this process, the VCO frequency $f_{VCO}$ can be completely matched with the required frequency.

It is disclosed in Japanese Laid-open patent publication 2001-339301, that the frequency synthesizer is provided with a prescaler and a counter that outputs a frequency division signal of an output of the VCO, a reference frequency divider that frequency-divides the frequency of a reference signal source, a frequency adjustment means that detects a frequency error of an output signal between the counter and the reference frequency divider and provides the output of a signal to switch capacitance or resistance of a resonance circuit of the VCO depending on the result of detection, and a bias control means that applies an optical voltage V1 to a control voltage terminal of the VCO at the operation of the frequency adjustment means to bring the output signal of a charge pump to a high impedance state. It is described in the publication that since the resonance frequency of the resonance circuit is changed in response to the actual oscillated frequency of the VCO, the VCO is phase-locked at a desired frequency and since the VCO can be integrated as an IC, the VCO can be miniaturized at a low cost.

It is disclosed in Japanese Laid-open patent publication 2003-152535, that a VCO, constituting the PLL circuit, is configured to enable it to operate in a plurality of bands. In the state wherein the controlling voltage of the oscillation circuit of the VCO is fastened to a predetermined value, the oscillation frequencies of the oscillation circuit are measured in the respective bands to store them in a memory circuit. Then, by comparing the stored frequency measurement values with the set value for assigning the band given, when operating the PLL circuit, the band used actually in the oscillation circuit is determined from the comparison result thereof.

It is disclosed in Japanese Laid-open patent publication 2003-264461, that in a frequency synthesizer having a voltage-controlled oscillator capable of selecting a plurality of frequency bands by using a control signals CSW1 to 4, the control voltage Vt of the voltage-controlled oscillator is fixed to a constant voltage V2 when a power is applied, the control signals CSW1 to 4 are varied at fixed time intervals on the basis of a reference frequency, the oscillation frequencies of the respective frequency bands at Vt=V2 are detected by a counter and stored in a register. The values of the CSW1 to 4 are determined by converting the division ratio data into frequency data by using a conversion circuit and comparing the resultant frequency data with a value of the register when the division ratio data is inputted.

It is disclosed in Japanese Laid-open patent publication 2003-318732, that an oscillation circuit (VCO) comprising the PLL circuit is constructed operably in several bands. A control voltage (Vc) of the oscillation circuit is fixed to a predetermined value (V DC), and oscillation frequency of the oscillation circuit in each of the bands is measured and stored in a storage circuit. A set value for specifying the band, given during the operation of the PLL and the measured frequency value which is stored in this way, are compared and the band to be actually used in the oscillation circuit is determined by the result of comparison. Also, the frequency difference between the maximum frequency of the selected band and the set frequency is found, and a control voltage which is closest to the set frequency is determined from the frequency difference ad the variable range of frequency of the selected band. The control voltage is applied to the oscillation circuit for starting its oscillation operations, and then a PLL loop is closed and locked.

As for the conventional PLL frequency synthesizer shown in FIG. 14, the repetitive times of a step for detecting a value of a selection signal VCOSEL[m-1:0] by which the desired VCO frequency $f_{VCO}$ is obtained, in discretely adjusting process, increase in proportion to the number of fixed-value capacitors included in the VCO unit 110. Hence, when the VCO unit 110 includes many fixed-value capacitors, long times are necessary to detect the final objective selection signal VCOSEL[m-1:0], so that the demands of "high-speed responsibility" and "wider bandwidth" for the VCO unit and the PLL unit cannot be obtained.

It means that, in order to realize the demand of "wider bandwidth", it is necessary to increase the number of fixed-value capacitors C0, C1, C2, . . . , Cm-1, shown in FIG. 14. However, the increase of the number of the fixed-value capacitors means the extension of the range of the selection signal VCOSEL[m-1:0] shown in FIG. 16. Assuming that the selection signal VCOSEL[m-1:0] is expressed in binary values, the range of the value of the selection signal becomes 0 to $2^m-1$. For example, if the number of the fixed-value capacitors is 10, the selection signal VCOSEL[m-1:0] will be expressed in 10 bit-binary values, thus the range of the value of the selection signal becomes 0 to 1023.

As for the PLL frequency synthesizer shown in FIG. 14, discretely adjusting process for the VCO frequency $f_{VCO}$ is controlled by the VCO selector unit 120. In this case, firstly, the convergence test of the VCO frequency $f_{VCO}$ at a certain point with an expected value is operated. When the VCO frequency $f_{VCO}$ at the point does not satisfy the convergence range, a binary test in which the frequency $f_{VCO}$ is higher (or lower) than the expected value is judged is operated. Then, the selection signal VCOSEL [m-1:0] is changed by 1 on the basis of the binary test. Then the convergence test is operated again. These processes are repeated until the frequency $f_{VCO}$ satisfies the convergence range.

In the case where the number of the fixed-value capacitors is 10, and the selection signal VCOSEL[m-1:0] is expressed in 10 bit-binary values, as described above, if the initial value of the selection signal VCOSEL[m-1:0] is "0", the convergence test is repeated at most 1023 times. Even if the initial value of the selection signal VCOSEL [m-1:0] is set as "511" to decrease the number of convergence tests, the test is repeated at most 512 times.

Therefore, it has been a problem in the conventional PLL frequency synthesizer that the demands of "high-speed responsibility" and "wider bandwidth" are incompatible because the time required for the discretely adjusting process for the VCO frequency $f_{VCO}$ increases in proportion to "wider bandwidth".

In addition, as for the techniques described in the publications mentioned above, it is difficult to actualize the demands of "high-speed responsibility" and "wider bandwidth" at the same time.

SUMMARY OF THE INVENTION

The present invention has been made in view of the foregoing circumstances and an object thereof is to provide a PLL frequency synthesizer and an automatic selection method of frequency to actualize a wider bandwidth and a high-speed responsibility at the same time.

According to the present invention, there is provided a phase locked loop frequency synthesizer, comprising: An LC-tank circuit which includes an inductor and a variable capacitor in which the capacity changes depending on the input voltage; a group of fixed-value capacitors which is connected to said LC-tank circuit in parallel; a voltage control oscillating unit which outputs a signal with a frequency determined by said LC-tank circuit and said group of fixed-value capacitors; a phase control unit which generates an output current based on an error operator between a first signal with a divided frequency of a reference frequency and a second signal with a divided frequency of said frequency output from said voltage control oscillating unit; a fixed-value capacitor controlling unit which outputs a selection signal which determines the combination of said fixed-value capacitors to be connected to said LC-tank circuit in parallel based on a frequency dividing ratio setting signal including information about dividing ratio of said second signal, and controls the connection of said fixed-value capacitors selected from said group of fixed-value capacitors based on said selection signal to said LC-tank circuit in parallel; and a variable capacitor controlling unit which selects either one of a fixed bias voltage and the voltage obtained by converting said output current output from said phase control unit and inputs the selected voltage to said variable capacitor of said LC-tank circuit. The phase control unit compares the phase or frequency of the first signal with that of the second signal to output the error operator.

In the phase locked loop frequency synthesizer of the present invention, said fixed-value capacitor controlling unit may be operated to change the selection signal to determine an optimal selection signal while said variable capacitor controlling unit selects said fixed bias voltage, and said variable capacitor controlling unit may be operated to select said voltage obtained by converting said output current output from said phase control unit while said fixed-value capacitor controlling unit is fixed to output said optimal selection signal.

In the phase locked loop frequency synthesizer of the present invention, said fixed-value capacitor controlling unit may determine an initial value of said selection signal based on said frequency dividing ratio setting signal.

In the phase locked loop frequency synthesizer of the present invention, said fixed-value capacitor controlling unit may include: a first counter which counts said first signal; a second counter which counts the count number of said second counts while said first counter counts predetermined numbers of said first signal; a calculation unit that calculates an ideal value for said count number of said second signal while said predetermined numbers of said first signal is counted; and a comparator which compares said count number counted by said second counter and said ideal value calculated by said calculation unit to output differential operator thereof, and said fixed-value capacitor controlling unit may correct said selection signal based on said differential operator to output to voltage control oscillating.

In the phase locked loop frequency synthesizer of the present invention, said fixed-value capacitor controlling unit may include a count number setting unit which accepts a setting of a judgment accuracy of said fixed-value capacitor controlling unit and sets said predetermined numbers of said first signal based on said judgment accuracy.

In the phase locked loop frequency synthesizer of the present invention, said fixed-value capacitor controlling unit may include a memory unit which stores said differential operator obtained by said comparator when said selection signal is determined based on a center of frequency of a used frequency bandwidth, as an initial differential operator, and said fixed-value capacitor controlling unit may determine an initial value of said selection signal based on said initial differential operator when said initial differential operator is stored in said memory unit.

In the phase locked loop frequency synthesizer of the present invention, said fixed-value capacitor controlling unit may include a judging unit which judges whether said differential operator output from said comparator is within a predetermined convergence range or not, and said fixed-value capacitor controlling unit may output a termination signal indicating the termination of the process of said fixed-value capacitor controlling unit.

According to the present invention, there is provided a method of automatically selecting a frequency of an oscillator including a voltage control oscillating unit which includes an LC-tank circuit which includes an inductor and a variable capacitor in which the capacity changes depending on the input voltage and a group of fixed-value capacitors which is connected to said LC-tank circuit in parallel, and outputs a signal with a frequency determined by said LC-tank circuit and said group of fixed-value capacitors, comprising: a digital tuning process including outputting a selection signal which determines the combination of said fixed-value capacitors to be connected to said LC-tank circuit in parallel based on a frequency dividing ratio setting signal including information about dividing ratio of a signal with a divided frequency of the frequency output from said voltage control oscillating unit, and controlling the connection of said fixed-value capacitors selected from said group of fixed-value capacitors based on said selection signal to said LC-tank circuit in parallel; and an analog tuning process including converting an output current generated based on an error operator between a first signal with a divided frequency of a reference frequency and a second signal with a divided frequency of said frequency output from said voltage control oscillating unit, and inputting said error operator to said variable capacitor, wherein said converting and said inputting are repeated until said second signal becomes same as said first signal; wherein a fixed bias voltage is supplied to said variable capacitor in said digital tuning process, and said selection signal is fixed to a final selection signal set in said digital tuning process, in said analog tuning process.

In the method of automatically selecting a frequency of an oscillator of the present invention, said digital tuning process may further include determining an initial value of said selection signal based on said frequency dividing ratio setting signal.

In the method of automatically selecting a frequency of an oscillator of the present invention, said digital tuning process may further include: counting said first signal; counting the count number of said second signal while said counting said first signal counts predetermined numbers of said first signal; calculating an ideal value for said count number of said second signal while said predetermined numbers of said first signal is counted; comparing said count number counted in said counting the count number of said second signal and said ideal value calculated in said calculating an ideal value to output differential operator thereof; correcting said selection signal based on said differential operator to output thereof.

In the method of automatically selecting a frequency of an oscillator of the present invention, said digital tuning process may further include judging whether said differential operator output in said comparing is within a predetermined convergence range or not; and outputting a termination signal indicating the termination of said digital tuning process; wherein said analog tuning process is started based on said termination signal of said digital tuning process.

In the method of automatically selecting a frequency of an oscillator of the present invention, said digital tuning process may further include storing said differential operator obtained in said comparing when said selection signal is determined based on a center of frequency of a used frequency bandwidth, as an initial differential operator; and determines an initial value of said selection signal based on said initial differential operator after said initial differential operator is stored in said storing.

According to the present invention, since an initial value of the selection signal to select the combination of the fixed-value capacitors to be connected to the LC-tank circuit in parallel is obtained based on the predetermined frequency dividing ratio setting signal, the number of repetition time for the convergence can be reduced.

According to the present invention, since the selection signal is corrected by the feedback according to the difference between the present actual value and the calculated expected value, the number of repetition time for the convergence can be reduced.

Furthermore, according to the present invention, since the judgment accuracy can be set externally, the number of repetition time for the convergence can be reduced. Hence, according to the present invention, the number of repetition time for the convergence can be reduced in the digital tuning process so that two demands required for the phase locked loop frequency synthesizer, "high-speed responsibility" and "wider bandwidth", can be compatible with the shortest convergence time.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
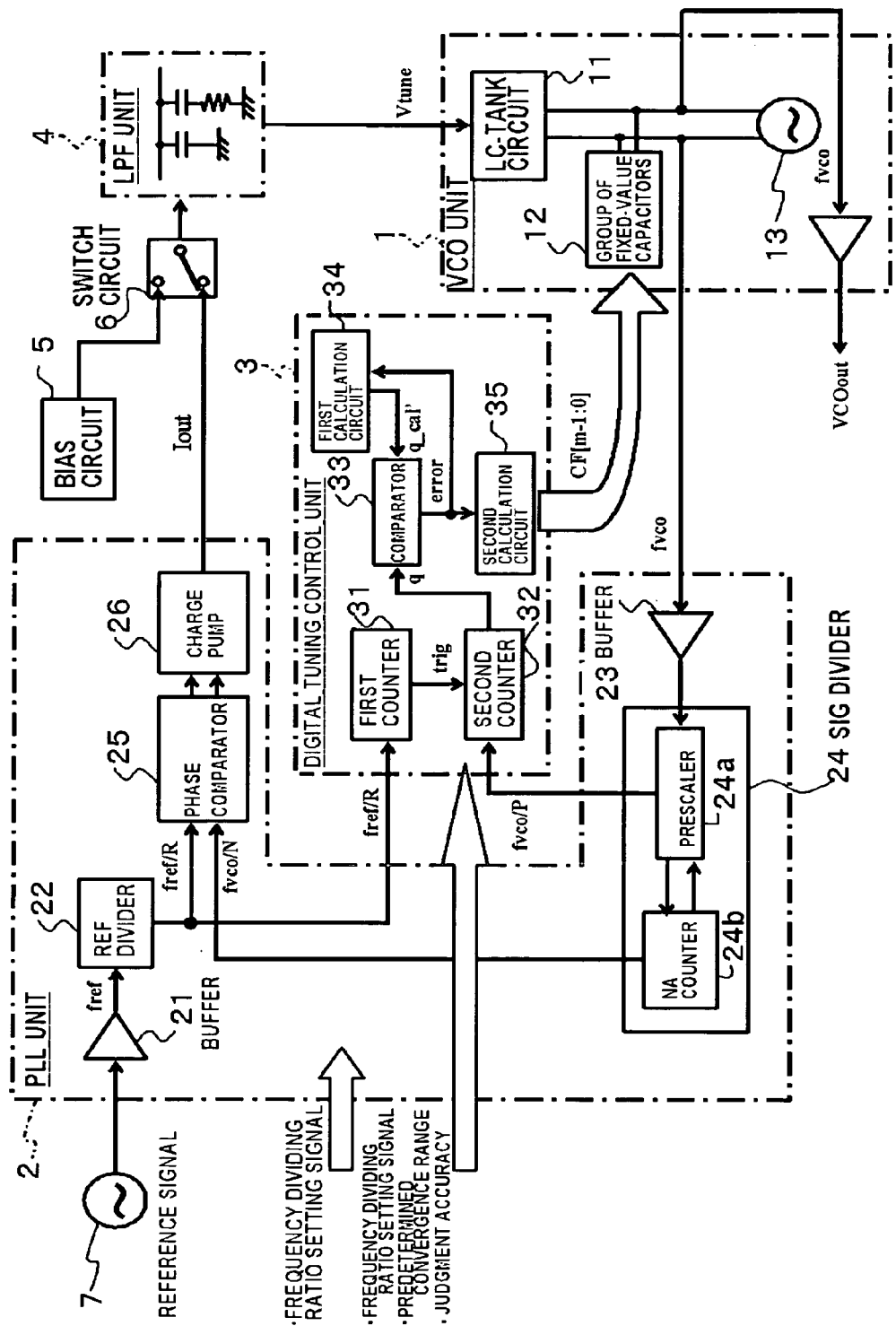
FIG. 1 shows a block diagram of a PLL frequency synthesizer of the first embodiment according to the present invention.

FIG. 1 shows a block diagram of a PLL frequency synthesizer of the first embodiment according to the present invention.

As shown in FIG. 1, the PLL frequency synthesizer of the embodiment includes an oscillator unit (VCO unit) 1, a phase control unit (PLL unit) 2, a digital tuning control unit 3, a low pass filter unit (LPF unit) 4, a bias circuit 5, and a switch circuit 6.

The VOC unit 1 includes an LC-tank circuit 11, a group of fixed-value capacitors 12 and an oscillator circuit 13.

Figure 2:
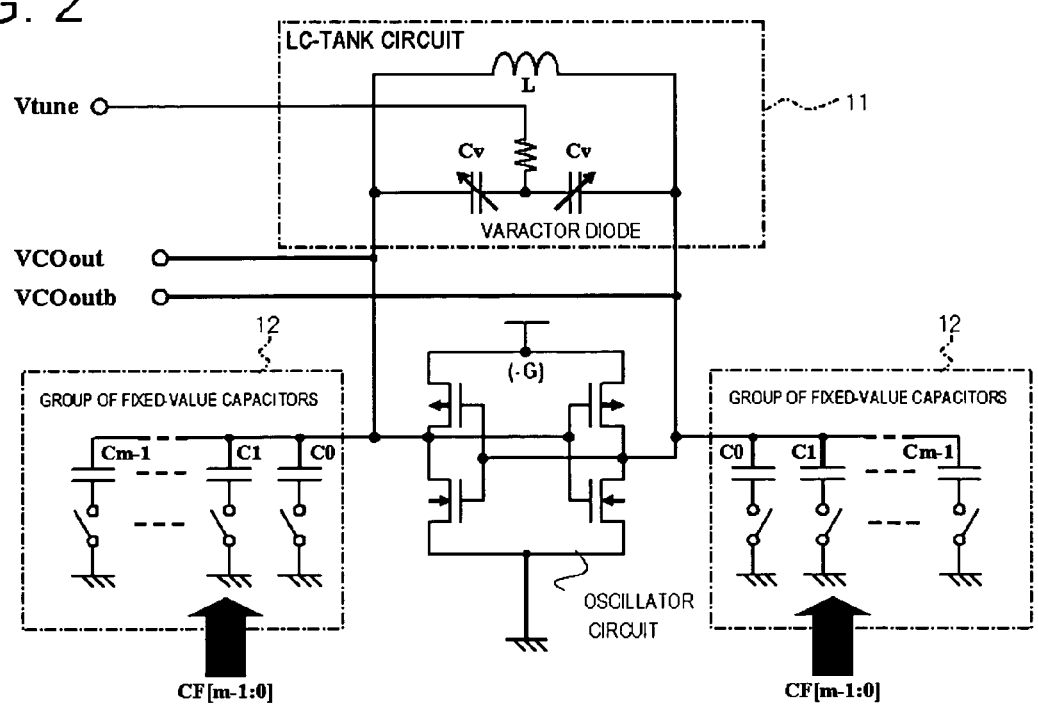
FIG. 2 shows a detailed structure of the VCO unit of the embodiment according to the present invention.

FIG. 2 shows a detailed structure of the VCO unit 1 shown in FIG. 1. The LC-tank circuit 11 includes an inductor L and two variable capacitors Cv each of which including a varactor diode, where the variable capacitors Cv are connected in series with each other and the inductor L is connected in parallel to the variable capacitors Cv. Thus, the parallel resonance circuit is constructed. Here, the VCO unit 1 includes two groups of fixed-value capacitors 12 each of which including a plurality of fixed-value capacitors C0, C1, C2, ..., and Cm-1. Each of the fixed-value capacitors C0, C1, C2, ..., and Cm-1 becomes effective when it is grounded by the switch connected therewith. Each of the switches is controlled on/off by a selection signal CF[m-1:0]. The oscillating circuit 13 includes a negative mutual conductance (–G) and oscillates with a frequency $f_{VCO}$ determined by the LC-tank circuit 11 and some of the fixed-value capacitors C0, C1, C2, ..., and Cm-1 selected from the group of fixed-value capacitors 12.

Referring back to FIG. 1, the PLL unit 2 includes a buffer 21, a reference frequency divider (REF divider) 22, a buffer 23, an oscillating signal divider (SIG divider) 24, a phase comparator 25 and a charge pump 26.

The buffer 21 buffers a signal with a reference frequency $f_{ref}$ (reference signal $f_{ref}$) output from a reference signal source 7 and outputs it to the REF divider 22. The REF divider 22 divides the reference signal $f_{ref}$ by R and outputs the R-divided signal $f_{ref}$/R.

The buffer 23 buffers the VCO frequency $f_{VCO}$ output from the VCO unit 1 and outputs it to the SIG divider 24.

The SIG divider 24 includes a prescaler 24a and a NA counter 24b. The prescaler 24a divides the oscillating signal $f_{VCO}$ output from the buffer 23 by P and outputs the P-divided signal $f_{VCO}$/P. The NA counter 24b includes a two-step counter and divides the oscillating signal $f_{VCO}$ by N to output the N-divided signal $f_{VCO}$/N.

The phase comparator 25 compares the frequency and the phase of the R-divided signal $f_{ref}$/R output from the REF divider 22 with that of the N-divided signal $f_{VCO}$/N output from the NA counter 24b of the SIG divider 24 to outputs the error component thereof. The charge pump 26 generates an output current Iout based on the error component of the compared result by the phase comparator 25.

The digital tuning control unit (or fixed-value capacitor controlling unit) 3 includes a first counter 31, a second counter 32, a comparator 33, a first calculation circuit 34 and a second calculation circuit 35.

The first counter 31 counts the cycles of the R-divided signal $f_{ref}$/R output from the REF divider 22. The first counter 31 outputs the output signal trig set at "High" until the count value becomes "n", and outputs the output signal trig set at "Low" when the count value reaches "n". The count number "n" is a variable value set by the first calculation circuit 34 based on the judgment accuracy given as an external signal.

The second counter 32 counts the cycles of the P-divided signal $f_{VCO}$/P while the output signal trig output from the first counter 31 is set at "High" and outputs the counted result "q" to the comparator 33.

The first calculation circuit 34 controls the entire operation of the digital tuning control unit 3. The first calculation circuit 34 inputs a frequency dividing ratio setting signal (or a channel selection signal), a predetermined convergence range, and a judgment accuracy as external signals. In addition, the first calculation circuit 34 inputs an output "error" from the comparator 33. The first calculation circuit 34 outputs a calculated value q_cal' to the comparator 33.

The first calculation circuit 34 calculates an initial value "CF_0' of the selection signal CF[m-1:0] for the switches of the fixed-value capacitors of the VCO unit 1 based on an internal formula and the frequency dividing ratio setting signal. Further, the first calculation circuit 34 outputs a termination signal for terminating the process of digital tuning by comparing the output "error" from the comparator 33 with the predetermined convergence range. Further, the first calculation circuit 34 outputs the dividing number R for the REF divider 22, the dividing number N for the SIG divider 24 and the dividing number P for the prescaler 24a.

The comparator 33 compares the count result "q" output from the second counter 32 with the calculated value q_cal' to output the differential operator as the output "error".

The second calculation circuit 35 corrects the selection signal CF[m-1:0] based on the output "error" from the comparator 33 to output the corrected value to the group of fixed-value capacitors 12 of the VOC unit 1.

The bias circuit 5 outputs a reference voltage as a bias voltage. The switching circuit 6 includes a switch for selectively connecting the LPF unit 4 to the bias circuit 5 or the charge pump 26. The switching circuit 6 connects the LPF unit 4 to the bias circuit 5 at the process of digital tuning and connects the LPF unit 4 to the charge pump 26 at the process of analog tuning.

The LPF unit 4 includes passive circuits such as capacitances (C) and resistances (R). The LPF unit 4 outputs the output voltage output from the bias circuit 5 as it is at the process of digital tuning and converts the output current output from the charge pump 26 to the voltage by charging or discharging the output current to the capacitors in the LPF unit 4 at the process of analog tuning.

The operation of the PLL frequency synthesizer in this embodiment will be explained with reference to FIG. 3 and FIG. 4.

The operation of the PLL frequency synthesizer in this embodiment includes two processes, the process of digital tuning and the process of analog tuning, where these processes are executed in this order. Although it is not described in the drawing, the PLL frequency synthesizer includes a control unit which controls the operation of the components of the PLL frequency synthesizer such that the process of digital tuning and the process of analog tuning are executed in this order.

Figure 3:
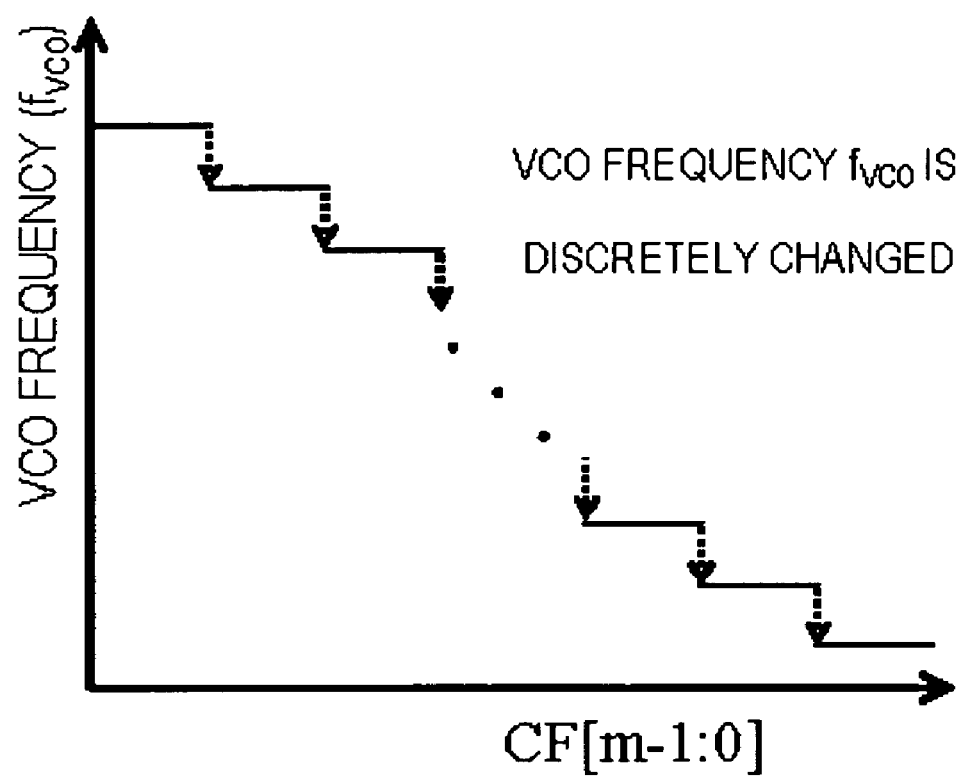
FIG. 3 shows a relationship between the selection signal CF[m-1:0] and the VCO frequency of the embodiment according to the present invention.

FIG. 3 shows a relationship between the selection signal CF[m-1:0] and the VCO frequency $f_{VCO}$. In the process of digital tuning, the VCO frequency $f_{VCO}$ can be discretely changed as the selection signal CF[m-1:0] changes. In this process, the operations of the phase comparator 25 and the charge pump 26 of the PLL unit 2 are stopped and the switching circuit 6 connects the LPF unit 4 to the bias circuit 5. Therefore, the control voltage Vtune of the VCO unit 1 is fixed at a predetermined bias voltage output from the bias circuit 5.

It means that the VCO frequency $f_{VCO}$ is controlled only by the selection signal CF[m-1:0], hence the digital tuning control unit 3 controls the VCO frequency $f_{VCO}$. The selection signal CF[m-1:0] includes a plurality of bits, same bit's number as the number of the fixed-value capacitors. The combination of the fixed-value capacitors is determined by the value of the respective bits of the selection signal CF[m-1:0], and the selection signal CF[m-1:0] is determined such that the discrete changes of the VCO frequency $f_{VCO}$ have almost even intervals.

Figure 4:
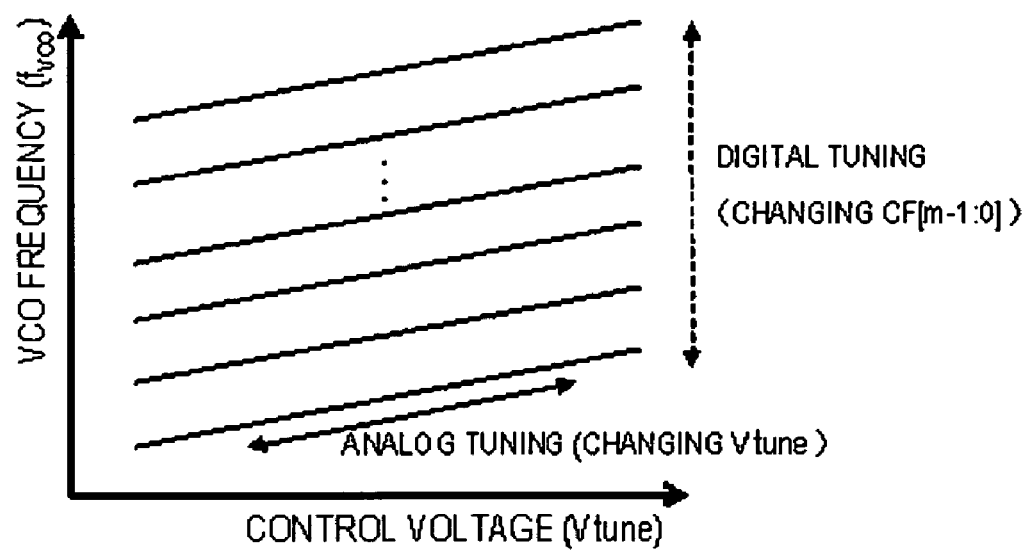
FIG. 4 shows a relationship between the control voltage Vtune and the VCO frequency in the VCO unit of the embodiment according to the present invention.

FIG. 4 shows a relationship between the control voltage Vtune and the VCO frequency $f_{VCO}$ in the VCO unit 1.

In the process of analog tuning, the VCO frequency $f_{VCO}$ is changed by changing the control voltage Vtune. In this process, the operation of the digital tuning control unit 3 is stopped with holding the selection signal CF[m-1:0] fixed at the final process of the digital tuning. The switching circuit 6 connects the LPF unit 4 to the charge pump 26. At this time, the operations of the phase comparator 25 and the charge pump 26, which were stopped in the process of digital tuning, are started. It means that the VCO frequency $f_{VCO}$ is controlled only by the control voltage Vtune, hence the PLL unit 2 controls the VCO frequency $f_{VCO}$.

Figure 5A:
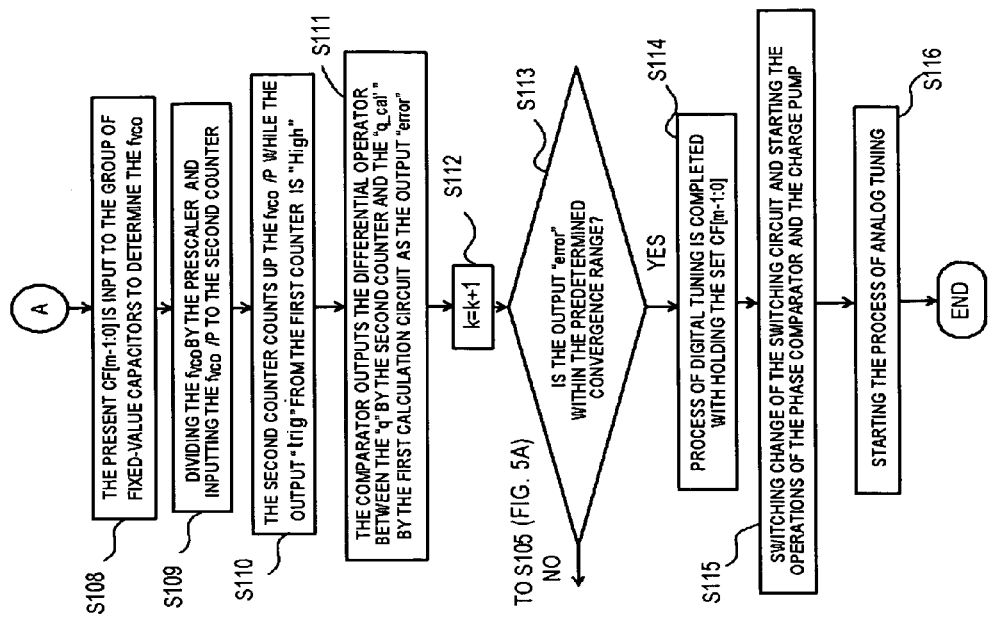
FIGS. 5A and 5B show flow charts of the operation of the PLL frequency synthesizer of the embodiment according to the present invention.
Figure 5B:
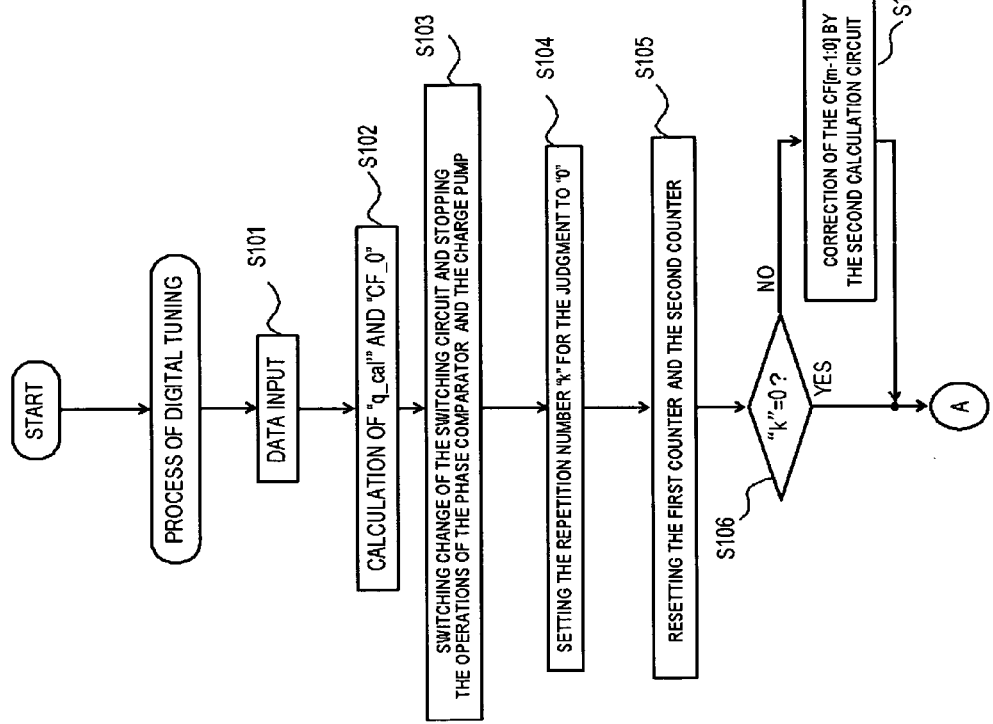

The operation of the PLL frequency synthesizer in this embodiment will be explained in more detail with reference to FIGS. 5A and 5B. FIGS. 5A and 5B show flow charts of the operation of the PLL frequency synthesizer.

A. Process of Digital Tuning

Data Input (Step S101)

The frequency dividing ratio setting signal is input to the PLL unit 2 and to the digital tuning control unit 3. The predetermined convergence range and the judgment accuracy are also input to the digital tuning control unit 3.

Calculation of the Calculated Value "q_cal'" and the Initial Value "CF_0" by the First Calculation Circuit 34 (Step S102)

The frequency dividing ratio setting signal, the predetermined convergence range and the judgment accuracy are input to the first calculation circuit 34 and two parameters including the calculated value "q_cal'" and the initial value "CF_0" are calculated. As for calculating the calculated value "q_cal'" and the initial value "CF_0", the equations (4) and (6), described hereinafter, are respectively used.

Switching Change of the Switching Circuit 6 and Stopping the Operations of the Phase Comparator 25 and the Charge Pump 26 (Step S103)

The input of the switching circuit 6 is connected to the bias circuit 5 and the operations of the phase comparator 25 and the charge pump 26 of the PLL unit 2 are stopped such that the output Iout of the PLL unit 2 is not input to the switching circuit 6.

Setting the Repetition Number "k" for the Judgment to "0" (Step S104)

The repetition number "k" for the judgment is set to "0".

Resetting the First Counter 31 and the Second Counter 32 (Step S105)

The internal count values in the first counter 31 and the second counter 32 are set to "0".

Judging Whether "k"=0 (Step S106)

Whether the repetition number "k" is equal to zero or not is judged. When the repetition number "k" is "0" (Yes of Step S106), the next step will be Step S108, shown in FIG. 5B. When the repetition number "k" is not "0" (No of Step S106), the next step will be Step S107.

Correction of the CF[m-1:0] by the Second Calculation Circuit 35 (Process of Correcting the $f_{VCO}$) (Step S107)

The selection signal CF[m-1:0] to be set in a next step is calculated by the second calculation circuit 35 based on the present selection signal CF [m-1:0] and the output "error" from the comparator 33. The formula for the correction of the CF[m-1:0] is shown as equation (8) which will be described herein after.

The Present CF[m-1:0] is Input to the Group of Fixed-Value Capacitors to Determine the $f_{VCO}$ (Step S108)

The present selection signal CF[m-1:0] is input to the group of fixed-value capacitors 12 of the VCO unit 1 to change the VCO frequency $f_{VCO}$.

Dividing the $f_{VCO}$ by the Prescaler 24a and Inputting the Signal $f_{VCO}/P$ to the Second Counter 32 (Step S109)

The VCO frequency $f_{VCO}$ determined in step S108 is input to the prescaler 24a of the PLL unit 2. Then the divided signal "$f_{VCO}/P$" divided by the prescaler 24a is input to the NA counter 24b.

The Second Counter 32 Counts Up the Signal $F_{VCO}/P$ While the Output "trig" Output from the First Counter 31 is Set at "High" (Process of Detecting $f_{VCO}$) (Step S110)

The output signal "trig" from the first counter 31 is kept at "High" until the count value of the first counter 31 becomes "n" set in the first counter 31. The second counter 32 counts up the P-divided signal "$f_{VCO}/P$" during the period while the output signal "trig" is set at "High". The counted result "q" counted by the second counter 32 is output to the comparator 33.

The Comparator 33 Outputs the Differential Operator between the Counted Result "q" by the Second Counter 32 and the Calculated Value "q_cal'" by the First Calculation Circuit 34 as the Output "Error" (Process of Judging the $f_{VCO}$) (Step S111)

The comparator 33 compares the calculated value "q_cal'" obtained in step S102 and the counted value "q" obtained in step S110 to obtain the differential operator therebetween and outputs the result as the output "error" to the second calculation circuit 35.

Setting k=k+1 (step S112)

"1" is added to the repetition number "k".

Judging Whether the Output "Error" is within a Predetermined Convergence Range (Step S113)

The output "error" obtained in step S111 is compared with the predetermined convergence range set in step S102. When the output "error" is within the condition (Yes of Step S113), the next step will be step S114. When the output "error" is not within the condition (No of Step S113), the next step will be step S105.

Process of Digital Tuning is Completed with Holding the Set Selection Signal CF[m-1:0] (Step S114)

Process of digital tuning is completed with holding the present selection signal CF[m-1:0]. Then, the next step will be step S115 and the process of analog tuning is started.

B. Process of Analog Tuning

Switching Change of the Switching Circuit 6 and Starting the Operations of the Phase Comparator 25 and the Charge Pump 26 (Step S115)

The input of the switching circuit 6 is connected to the charge pump 6 and the operations of the phase comparator 25 and the charge pump 26, which have been stopped during the process of digital tuning, are started.

Starting the Process of Analog Tuning (where the $F_{VCO}$ is Controlled by the PLL Unit 2) (Step S116)

The PLL unit 2 changes the control voltage Vtune of the VCO unit 1 to make the VCO frequency $f_{VCO}$ convergent to the frequency provided as the frequency dividing ratio setting signal input in step S101. The entire process is terminated when the VCO frequency $f_{VCO}$ converges.

Next, the formulas necessary for calculations in the processes described above will be explained.

[1] T1: period or cycle of the input signal to the first counter 31 (T1=R/$f_{ref}$).
[2] T2: period or cycle of the input signal to the second counter 32 (T2=P/$f_{VCO}$).
[3] Tg: period while the output "trig" to the first counter 31 is kept at "High" (Tg=T1×n).
[4] n: setting value for the first counter 31 set by the first calculation circuit 34.
[5] q: counted result by the second counter 32.
[6] q_cal': calculated ideal value for the counted result q of the second counter 32. The counted result q obtained by the second counter 32 becomes q_cal' when the VCO frequency $f_{VCO}$ is equal to the frequency set by the frequency dividing ratio setting signal.
[7] freso: changes in the amount of the VCO frequency $f_{VCO}$ when the counted result q of the second counter 32 changes "1" (freso=$f_{VCO}$(q+1)−$f_{VCO}$(q)).
[8] $f_{VCO\_0}$: the VCO frequency when the selection signal CF[m-1:0]=0.
[9] CF_0: the selection signal CF[m-1:0] of the initial state of the process of digital tuning.
[10] the internal ideal formula: the relationship between the selection signal CF[m-1:0] and the VCO frequency $f_{VCO}$ defined by a linear equation. ($f_{VCO}$=$f_{VCO\_0}$−freso×CF[m-1:0])
[11] N: frequency dividing ratio of the SIG-divider 24 of the PLL unit 2 ($f_{VCO}$=$f_{ref}$×N).

Figure 6:
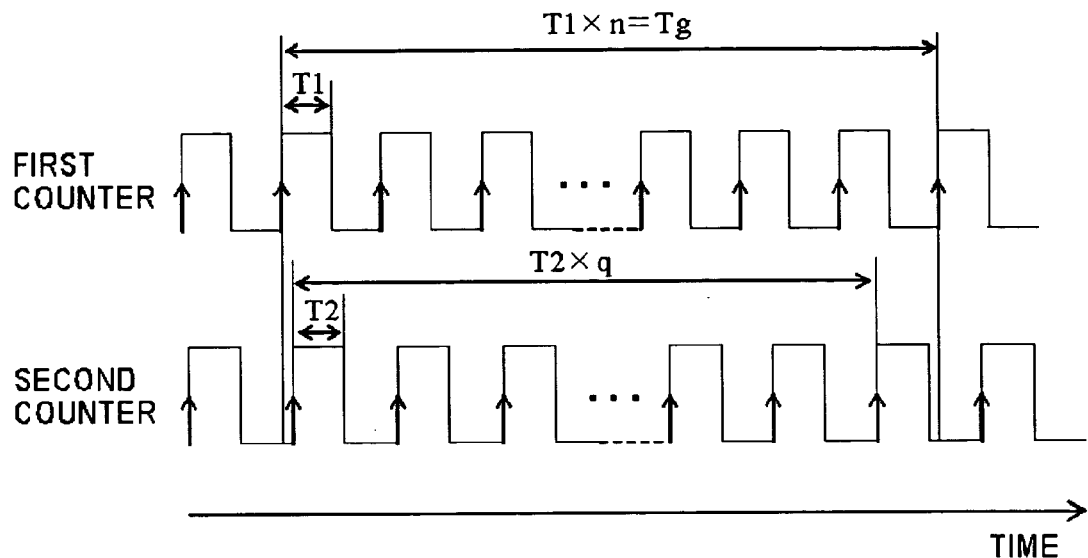
FIG. 6 shows the operation of the first counter and the second counter of the embodiment according to the present invention.

FIG. 6 shows the relationship between the counting operation of the first counter 31 and that of the second counter 32. From the relationship shown in FIG. 6, it can be obtained that:

$$Tg = T1 \times n = T2 \times q \qquad (1)$$

Since the counted result q has an error of ±1, the symble "≈" is used in equation (1), however, the term "≈" will be expressed simply as "=" hereinafter.

From the definitions [1] and [2] and the equation (1), (R/$f_{ref}$)×n=(P/$f_{VCO}$)×q, thus $$f_{VCO} = q \times f_{ref} \times P/(R \times n)$$

Here, in order to simplify the equation, it is assumed that R=1. And then, $$f_{VCO} = q \times f_{ref} \times P/n \qquad (2)$$

From the definition [11] and the equation (2), q=($f_{VCO}$/$f_{ref}$)×(n/P), thus $$q = N \times n/P \qquad (3)$$

Considering the right side of the equation (3), only "N" is changed when the VCO frequency $f_{VCO}$ is changed. Hence, it is possible to obtain the calculated ideal value "q_cal'" based on the frequency dividing ratio setting signal with the equation (3).

The calculated value "q_cal'" which is the ideal value for the q can be calculated as follows.

$$q\_cal' = N \times n/P \qquad (4)$$

From the definition [7] and the equation (2), $$freso = \{(q+1) \times f_{ref} \times P/n\} - \{(q) \times f_{ref} \times P/n\} \qquad (5)$$
$$= f_{ref} \times P/n$$

From the definition [10] and the equation (5), $$f_{VCO} = f_{VCO\_0} - (f_{ref} \times P/n) \times CF[m-1:0]$$

$$CF[m-1:0] = (f_{VCO\_0}/f_{ref}) \times (n/P) - (N \times n/P) \qquad (6)$$

Here, considering the right side of the equation (6), if the VCO frequency $f_{VCO\_0}$ obtained when the selection signal CF[m-1:0]=0 is previously stored, only "N" is changed when the VCO frequency $f_{VCO}$ is changed. Hence, it is possible to calculate the value CF_0 which is the initial value of the selection signal CF[m-1:0] with the equation (6).

The initial value CF_0 of the selection signal CF[m-1:0] is obtained by the following equation.

$$CF\_0 = (f_{VCO\_0}/f_{ref}) \times (n/P) - (N \times n/P)$$

The output of the second comparator 33 is, $$error = q - q\_cal' \qquad (7)$$

Hence, the following equation is calculated in the second calculation circuit 35, $$CF(k)=CF(k-1)-\text{error},$$

Where k is the repetition number for the judgment.

Here, as it is necessary to add weighted value to the value of the error based on the set judgment accuracy, the selection signal CF[m-1:0] becomes as follows, $$CF(k)=CF(k-1)-\text{error}\times n\_\text{max}/n \quad (8)$$

As mentioned above, there has been a problem that "wider bandwidth" and "high-speed responsibility" cannot be compatible with each other in the conventional PLL frequency synthesizers. However, this trade-off is solved in the PLL frequency synthesizer of the embodiment according to the present invention. The mechanism to solve this trade-off will be explained hereinafter.

The "wider bandwidth" of the PLL frequency synthesizer can be realized by increasing the number of the fixed-value capacitors composing the group of fixed-value capacitors 12 as shown in FIG. 2. Increase of the fixed-value capacitors composing the group of fixed-value capacitors 12 means that the range of the selection signal CF[m-1:0], the horizontal axis of the graph shown in FIG. 3, is increased, with the gradient characteristic of the VCO frequency $f_{VCO}$ kept as it is.

For example, when the selection signal CF[m-1:0] is given in binary value, the range of the selection signal CF[m-1:0] becomes 0 to $2^m-1$. When m=3 (when three fixed-value capacitances are included, defined by the weighted value in the binary value, in the group of fixed-value capacitors 12), the range of the selection signal CF[m-1:0] becomes 0 to 7. When m=10 (when ten fixed-value capacitances are included, defined by the weighted value in the binary value, in the group of fixed-value capacitors 12), the range of the selection signal CF[m-1:0] becomes 0 to 1023. Assuming that the gradient characteristic of the VCO frequency $f_{VCO}$ to the selection signal CF[m-1:0] in FIG. 3 does not change, the range of the VCO frequency $f_{VCO}$ is increased by 128 times.

The "high-speed responsibility" of the PLL frequency synthesizer, in addition to the "wider bandwidth" can be realized as follows.

As described above, when m=10 and the selection signal is expressed in 10 bits binary value, where the "wider bandwidth" of the PLL frequency synthesizer is realized, the selection signal CF[9:0] becomes 0 to 1023. In this case, conventionally, the process of judging the VCO frequency $f_{VCO}$ needs to be repeated 1023 times at a maximum when the initial value of the selection signal CF[m-1:0] is "0". Even if the initial value of CF[m-1:0] is set at "511" in order to reduce the repetition number, the process of judging the VCO frequency $f_{VCO}$ needs to be repeated 512 times at a maximum.

On the other hand, it is possible to reduce the convergence time of the PLL frequency synthesizer by applying the following three methods in the present embodiment of the PLL frequency synthesizer.

1. The initial value of the selection signal CF[m-1:0] is obtained by the dividing number "N" of the SIG divider 24 of the PLL unit 2 which is determined based on the frequency dividing ratio setting signal input to the PLL unit 2 and the equation (6). It means that the value CF_0 calculated based on the latest value of the VCO frequency $f_{VCO}$ with the equation (6) is used, the initial value for the process of judging the selection signal CF[m-1:0] can be set close to the final expected value, hence it is possible to reduce a number of repetition time for the convergence time of the PLL frequency synthesizer.

2. It is possible to calculate the differential operator between the present VCO frequency $f_{VCO}$ and an expected value of the VCO frequency $f_{VCO}$ to cause a feedback based on the differential operator.

As shown in the flow chart of the present embodiment in FIGS. 5A and 5B, if the predetermined convergence range is not satisfied after the process of detecting the VCO frequency $f_{VCO}$ in step S110 and the process of judging the VCO frequency $f_{VCO}$ in step S111, the corrected selection signal CF[m-1:0] is calculated with the equation (8) in the process of correcting the VCO frequency $f_{VCO}$ of step S107.

It means that, it is possible to correct the VCO frequency $f_{VCO}$ by the differential operator between the present VCO frequency $f_{VCO}$ and the expected value of the VCO frequency $f_{VCO}$ according to the present embodiment, although the VCO frequency $f_{VCO}$ can be changed by "+1" or "−1" in the conventional process of correcting the VCO frequency $f_{VCO}$ with the binary test. Therefore, the repetition number for judging the VCO frequency $f_{VCO}$ can be reduced.

3. Judgment accuracy can be set externally.

Figure 7:
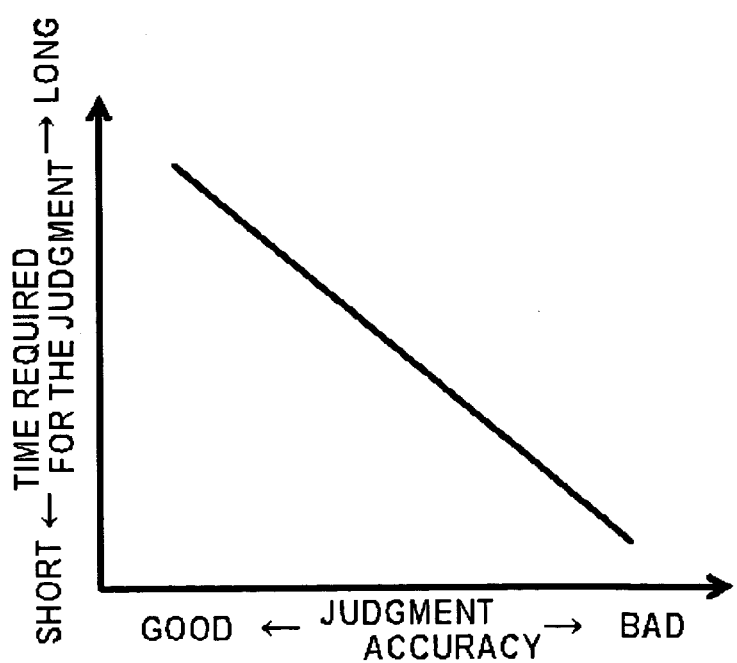
FIG. 7 shows relationship between the judgment accuracy and the time required for the judgment.

As shown in FIG. 7, the judgment accuracy and the time required for the judgment have a trade-off relationship (good accuracy=long time). Therefore, by setting the judgment accuracy bad (rough) at first and good (fine) at last, it is possible to minimize the time required for the judgment.

Thus, it is possible to realize "high-speed responsibility" of the PLL frequency synthesizer even if "wider bandwidth" is realized in the present embodiment of the PLL frequency synthesizer.

Second Embodiment

Figure 8:
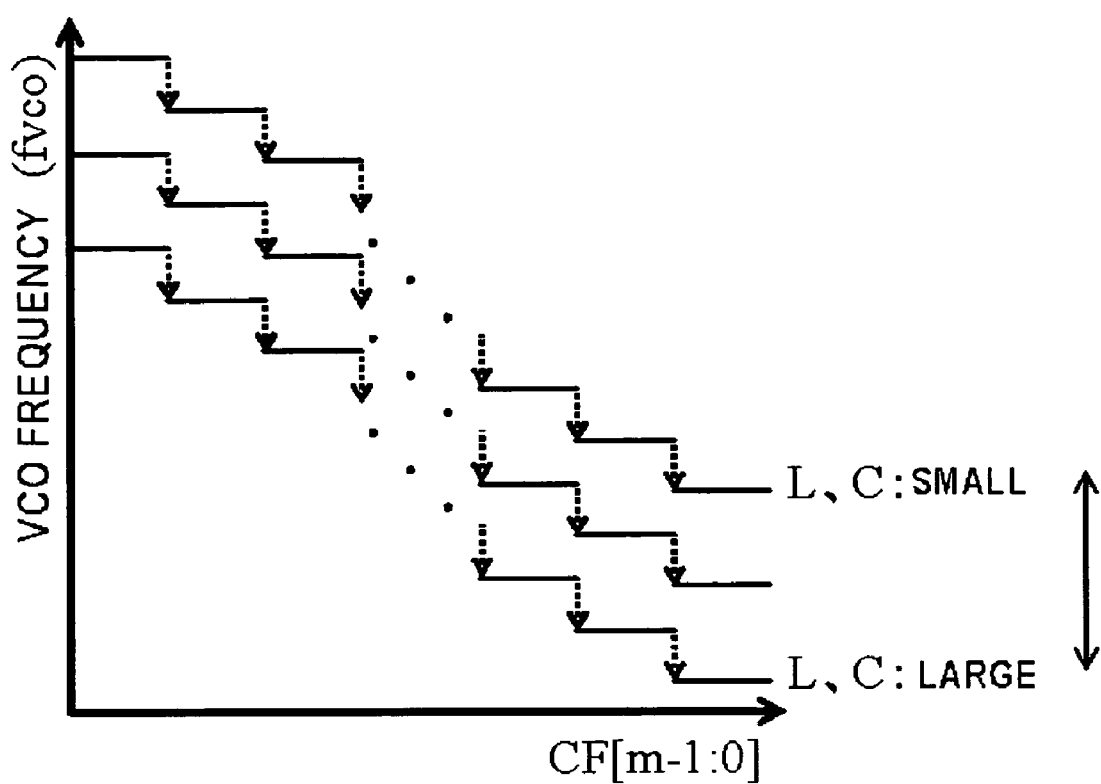
FIG. 8 shows relationship between the selection signal CF[m-1:0] and the VCO oscillating frequency when the amount of variation generated in manufacturing the PLL frequency synthesizer is taken into consideration.

The PLL frequency synthesizer of the present invention includes an oscillator (LC oscillator) with an LC resonator. The VCO frequency of the LC oscillator is determined by the following equation.

$$f_{VCO}=1/2\pi\sqrt{(L\times C)}$$

Where π is Ludolphian number. When the LC oscillator is formed on a semiconductor substrate, variations of the inductor (L) and the capacitor (C) generated in the manufacturing process cause variations of the characteristics of the VCO frequency $f_{VCO}$ for the same selection signal CF[m-1:0] as shown in FIG. 8.

The initial value CF_0 is calculated by the first calculation circuit 34 based on the above described internal ideal formula shown as the definition [10]. The variations of the products caused during the manufacturing process, as shown in FIG. 8, causes the error between the calculated initial value CF_0 and actual characteristics of the relationship between the selection signal CF[m-1:0] and the VCO frequency $f_{VCO}$. Such the error causes, in turn, increases of the repetition times for the convergence test. Thus the time required for the convergence is also increased.

In this embodiment, it is impossible to prevent increases of the repetition times for the convergence test or the time required for the convergence, even if there is the error between the calculated initial value CF_0 and actual characteristics of the relationship between the selection signal CF[m-1:0] and the VCO frequency $f_{VCO}$.

Figure 9:
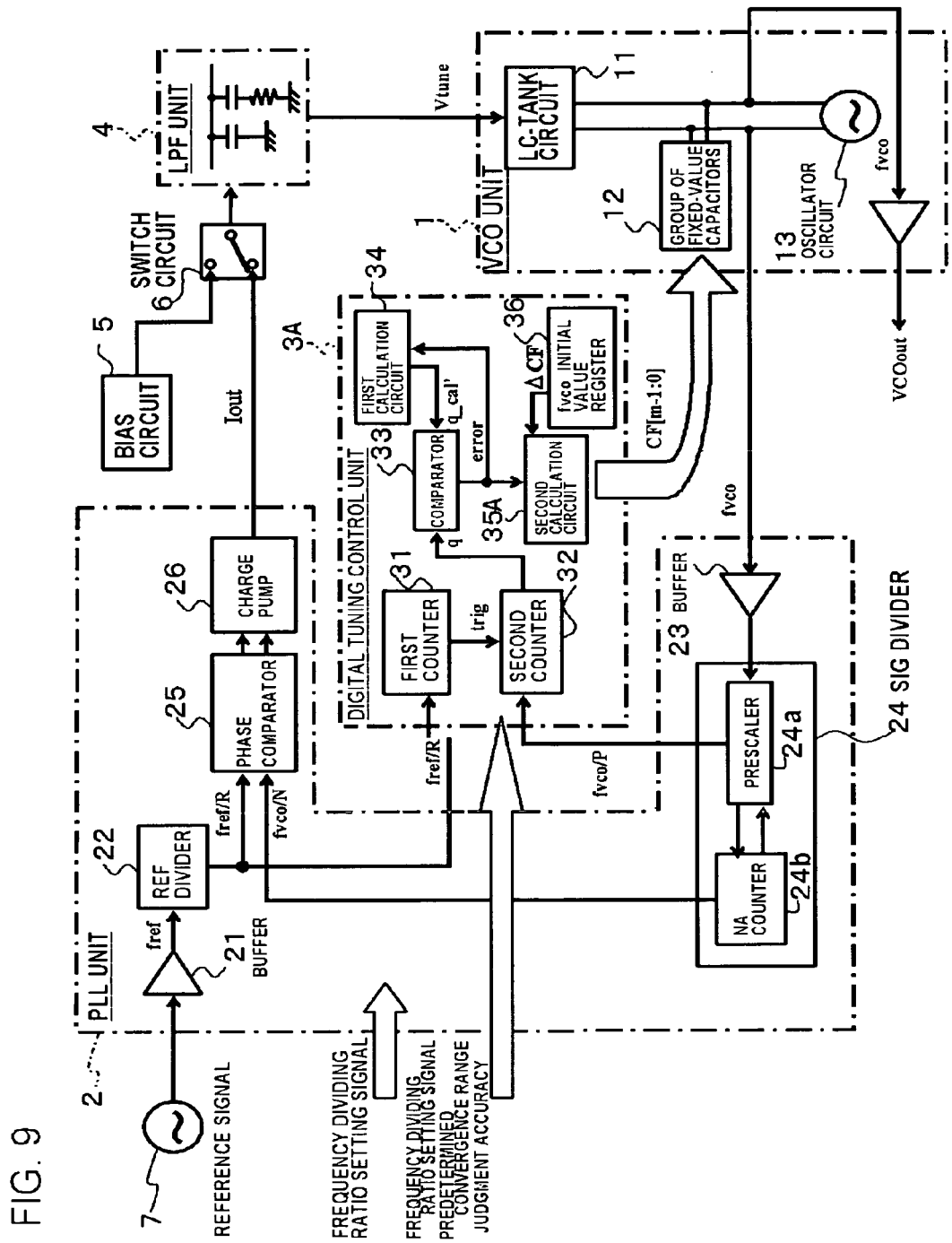
FIG. 9 shows a block diagram of a PLL frequency synthesizer of the second embodiment according to the present invention.

FIG. 9 shows a block diagram of a PLL frequency synthesizer of the second embodiment according to the present invention.

As shown in FIG. 9, the present PLL frequency synthesizer includes an oscillator unit (VCO unit) 1, a phase control unit (PLL unit) 2, a digital tuning control unit 3A, a low pass filter unit (LPF unit) 4, a bias circuit 5 and a switching circuit 6. Referring to FIG. 9, similar components to those illustrated in FIG. 1 referred to in the first embodiment are given the identical numerals, and description thereof shall be omitted as the case may be.

The digital tuning control unit 3A includes a first counter 31, a second counter 32, a comparator 33, a first calculation circuit 34, a second calculation circuit 35A and an $f_{VCO}$ initial value register.

The second calculation circuit 35A corrects the selection signal CF[m-1:0] based on the output "error" from the comparator 33, and calculates the differential value ΔCF of the selection signal CF[m-1:0] based on the output "error" from the comparator 33 at the beginning of the process. The $f_{VCO}$ initial value register 36 stores the differential value ΔCF of the selection signal CF[m-1:0] calculated by the second calculation circuit 35A.

Figure 10:
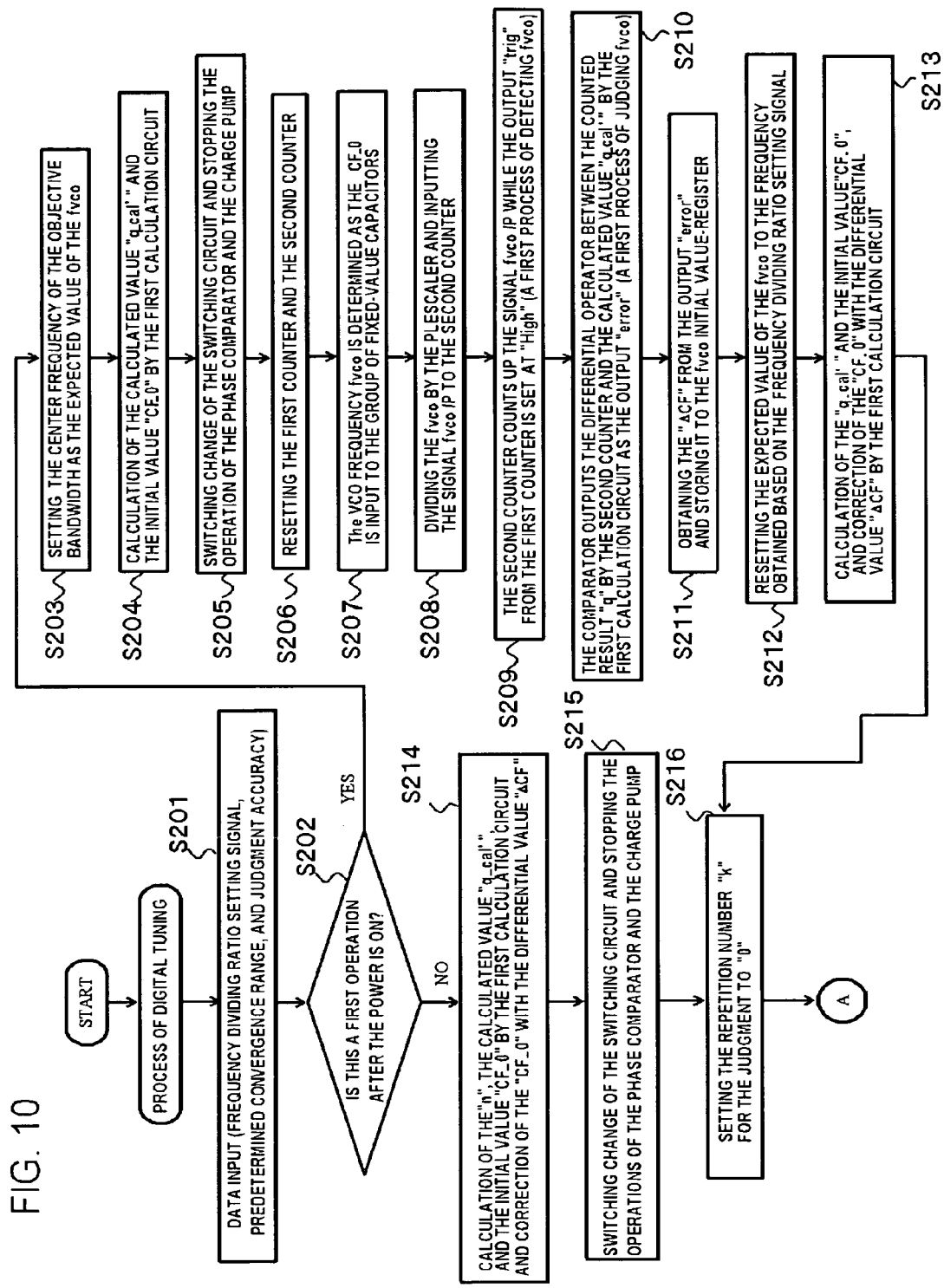
FIG. 10 shows a flow chart of the operation of the PLL frequency synthesizer of the embodiment according to the present invention.
Figure 11:
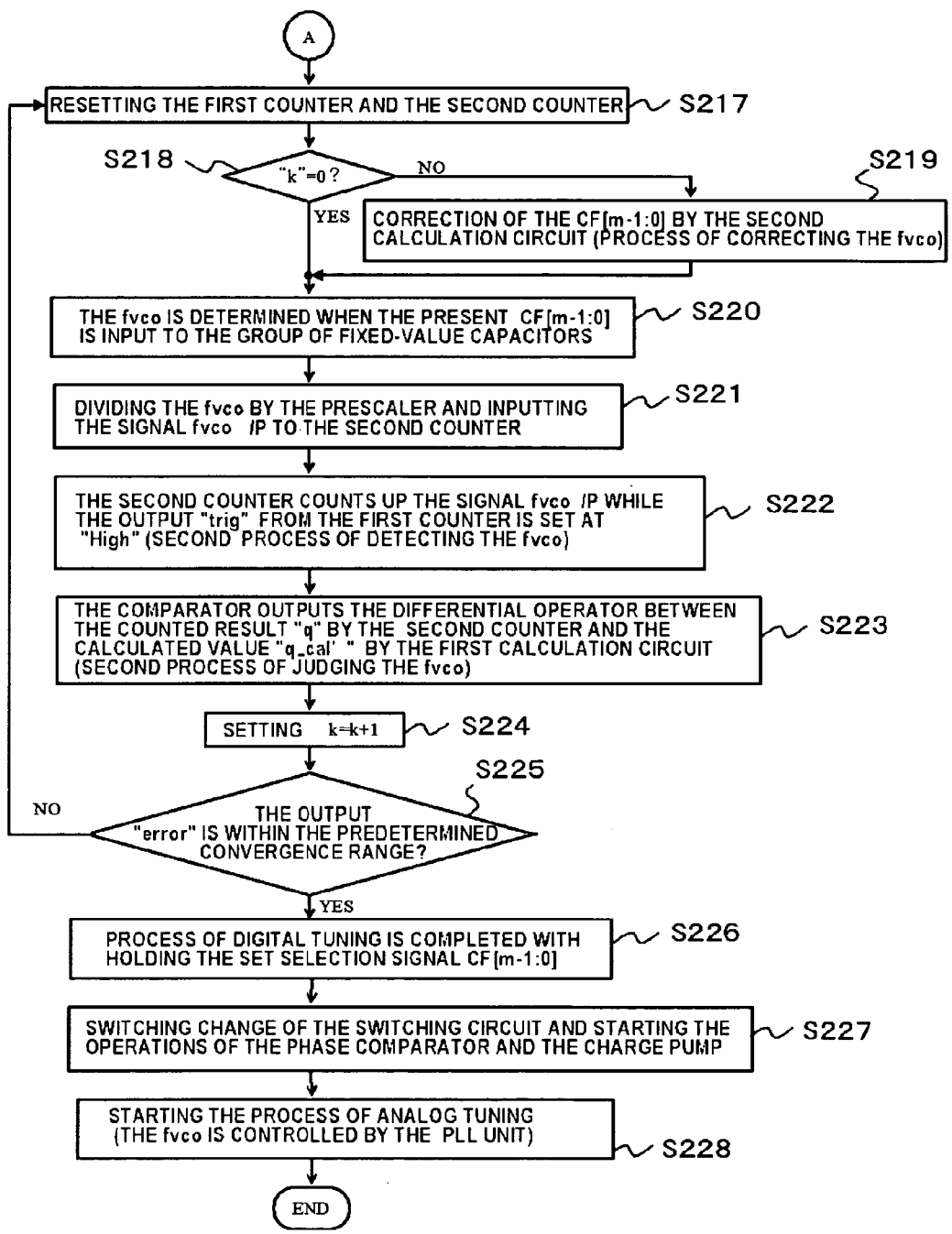
FIG. 11 shows a flow chart of the operation of the PLL frequency synthesizer of the embodiment according to the present invention.

The operation of the PLL frequency synthesizer in this embodiment will be explained in more detail with reference to FIG. 10 and FIG. 11.

A. Process of Digital Tuning

Data Input (Frequency Dividing Ratio Setting Signal, Predetermined Convergence Range, and Judgment Accuracy) (Step S201)

The frequency dividing ratio setting signal is input to the PLL unit 2 and the digital tuning control unit 3A. The predetermined convergence range and the judgment accuracy are also input the digital tuning control unit 3A.

Judging Whether it is the First Operation after the Power is on (Step S202)

If it is the first operation (Yes of Step S202), the step goes to step S203. If it is the second or later operation (No of Step S202), the step goes to step S214.

Setting the Center Frequency of the Objective Bandwidth as the Expected Value of the $F_{VCO}$ (Step S203)

The expected value of the $f_{VCO}$ is a finally obtainable VCO frequency $f_{VCO}$ after the process of digital tuning and the process of analog tuning. Here, the center frequency of objective bandwidth is set as the expected value of the $f_{VCO}$. Then, in the following step, the differential value between the selection signal CF[m-1:0] obtained by the internal ideal formula and the actual selection signal CF[m-1:0] is detected.

Calculation of the Calculated Value "q_cal'" and the Initial Value "CF_0" by the First Calculation Circuit 34 (Step S204)

Two parameters including the calculated value "q_cal'" and the initial value "CF_0" are calculated based on the expected value of the $f_{VCO}$ obtained in step S203. The formulas (4) and (6), described above, are respectively used to obtain the "q_cal'" and the "CF_0".

Switching Change of the Switching Circuit 6 and Stopping the Operation of the Phase Comparator 25 and the Charge Pump 26. (Step S205)

The input of the switching circuit 6 is connected to the bias circuit 5 and the operation of the phase comparator 25 and the charge pump 26 of the PLL unit 2 are stopped such that output Iout of the PLL unit 2 is not input to the switching circuit 6.

Resetting the First Counter 31 and the Second Counter 32 (Step S206)

The internal count values in the first counter 31 and the second counter 32 are set to "0" (counter reset).

The VCO Frequency $f_{VCO}$ is Determined as the CF_0 is Input to the Group of Fixed-Value Capacitors (Step S207)

The initial value "CF_0" of the selection signal CF[m-1:0] is input to the group of fixed-value capacitors 12 of the VCO unit 1. Then, the VCO frequency $f_{VCO}$ is determined.

Dividing the $f_{VCO}$ by the Prescaler 24a and Inputting the Signal $f_{VCO}$/P to the Second Counter 32 (Step S208)

The VCO frequency $f_{VCO}$ determined in step S207 is input to the prescaler 24a of the PLL unit 2. Then the divided signal "$f_{VCO}$/P" divided by the prescaler 24a is input to the second counter 32.

The Second Counter 32 Counts up the Signal $F_{VCO}$/P While the Output "trig" from the First Counter 31 is set at "High" (a First Process of Detecting $f_{VCO}$) (Step S209)

The output signal "trig" from the first counter 31 is kept at "High" until the count value of the first counter 31 becomes "n" set in the first counter 31. The second counter 32 counts up the P-divided signal "$f_{VCO}$/P" during the period while the output signal "trig" is set at "High". The counted result "q" counted by the second counter 32 is output to the comparator 33.

The Comparator 33 Outputs the Differential Operator Between the Counted Result "q" by the Second Counter 32 and the Calculated Value "q_cal'" by the First Calculation Circuit 34 as the Output "Error" (a First Process of Judging $f_{VCO}$) (Step S210)

The comparator 33 compares the calculated value "q_cal'" obtained in step S204 and the counted value "q" obtained in step S209 to obtain the differential operator therebetween and outputs the result as the output "error" to the second calculation circuit 35A.

Obtaining the "ΔCF" from the Output "error" and Storing it to the $f_{VCO}$ Initial Value-Register 36 (Step S211)

The output "error" obtained in step S210 is the differential operator between the internal ideal formula where the $f_{VCO}$ is the center of the VCO frequency and the actual characteristics of the VCO frequency $f_{VCO}$. This difference operator is stored in the $f_{VCO}$ initial value register as the differential value "ΔCF" of the selection signal CF[m-1:0]. After this, this "ΔCF" will be always used to calculate the initial value "CF_0".

Resetting the Expected Value of the $F_{VCO}$ to the Frequency Obtained Based on the Frequency Dividing Ratio Setting Signal (Step S212)

Although the center frequency of the objective bandwidth is set as the expected value of the $f_{VCO}$ in steps S203 to S211, the expected value of the $f_{VCO}$ is reset to the frequency obtained based on the frequency dividing ratio setting signal.

Calculation of the "q_cal'" and the Initial Value "CF_0", and Correction of the "CF_0" with the Differential Value "ΔCF" by the First Calculation Circuit 34 (Step S213)

The frequency dividing ratio setting signal, the predetermined convergence range and the judgment accuracy are input to the first calculation circuit 34 and two parameters including the calculated value "q_cal'" and the initial value "CF_0" are calculated. As for calculating the calculated value "q_cal' the formula (4) described above is used. As for calculating the initial value "CF_0", the following equation (9) is used.

$$CF\_0 = (f_{VCO}\_0/f_{ref}) \times (n/P) - (N \times n/P) - \Delta CF \qquad (9)$$

Then, the step goes to step S216.

Calculation of the "n", the Calculated Value "q_cal'", and the Initial Value "CF_0" by the First Calculation Circuit 34 and Correction of the "CF_0" with the Differential Value "ΔCF" (Step S214)

The frequency dividing ratio setting signal, the predetermined convergence range and the judgment accuracy are input to the first calculation circuit 34 and two parameters including the calculated value "q_cal'" and the initial value "CF_0" are calculated. As for calculating the calculated value "q_cal' and the initial value "CF_0", the equations (4) and (9), described above, are respectively used.

Switching Change of the Switching Circuit 6 and Stopping the Operations of the Phase Comparator 25 and the Charge Pump 26. (Step S215)

The input of the switching circuit 6 is connected to the bias circuit 5 and the operations of the phase comparator 25 and the charge pump 26 of the PLL unit 2 are stopped such that the output of the PLL unit 2 is not input to the switching circuit.

Setting the Repetition Number "k" for the Judgment to "0" (Step S216)

The repetition number "k" for the judgment is set to "0".

Resetting the First Counter 31 and the Second Counter 32 (Step S217)

The internal count values in the first counter 31 and the second counter 32 are set to "0".

Judging Whether "k"=0 (Step S218)

Whether the repetition number "k" is equal to zero or not is judged. When the repetition number "k" is "0" (Yes of Step S218), the step goes to Step S220. When the repetition number "k" is not "0" (No of Step S218), the step goes to Step S219.

Correction of the CF[m-1:0] by the Second Calculation Circuit 35A (Process of Correcting the $f_{VCO}$) (Step S219)

The selection signal CF[m-1:0] to be set in a next step is calculated by the second calculation circuit 35A based on the present selection signal CF[m-1:0] and the output "error" from the comparator 33 with the equation (8).

The $f_{VCO}$ is Determined when the Present CF[m-1:0] is Input to the Group of Fixed-Value Capacitors (Step S220)

The present selection signal CF[m-1:0] is output to the group of fixed-value capacitors 12 of the VCO unit 1 to change the VCO frequency $f_{VCO}$.

Dividing the $f_{VCO}$ by the Prescaler 24a and Inputting the Signal $f_{VCO}/P$ to the Second Counter 32 (Step S221)

The VCO frequency $f_{VCO}$ determined in step S220 is input to the prescaler 24a of the PLL unit 2. Then the divided signal "$f_{VCO}/P$" divided by the prescaler 24a is input to the second counter 32.

The Second Counter 32 Counts up the Signal $f_{VCO}/P$ while the Output "trig" from the First Counter 31 is Set at "High" (Second Process of Detecting the $f_{VCO}$) (Step S222)

The output signal "trig" from the first counter 31 is kept at "High" until the count value of the first counter 31 becomes "n" set in the first counter 31. The second counter 32 counts up the P-divided signal "$f_{VCO}/P$" during the period while the output signal "trig" is set at "High". The counted result "q" counted by the second counter 32 is output to the comparator 33.

The Comparator 33 Outputs the Differential Operator between the Counted Result "q" by the Second Counter 32 and the Calculated Value "q_cal'" by the First Calculation Circuit 34 (Second Process of Judging the $f_{VCO}$) (Step S223)

The comparator 33 compares the calculated value "q_cal'" obtained in step S213 and the counted value "q" obtained in step S214 to obtain the differential operator therebetween and outputs the result as the output "error" to the second calculation circuit 35A.

Setting k=k+1 (Step S224)

"1" is added to the repetition number "k".

Judging Whether the Output "Error" is within the Predetermined Convergence Range (Step S225)

The output "error" obtained in step S223 is compared with the predetermined convergence range set in step S201. When the output "error" is within the condition (Yes of Step S225), the next step will be step S226. When the output "error" is not within the condition (No of Step S225), the next step will be step S217.

Process of Digital Tuning is Completed with Holding the Set Selection Signal CF[m-1:0] (Step S226)

Process of digital tuning is completed with holding the present selection signal CF[m-1:0]. Then, the next step will be step S227.

B. Process of Analog Tuning

Switching Change of the Switching Circuit 6 and Starting the Operations of the Phase Comparator 25 and the Charge Pump 26 (Step S227)

The input of the switching circuit 6 is connected to the charge pump 6 and the operations of the phase comparator 25 and the charge pump 26, which have been stopped during the process of digital tuning, are started.

Starting the Process of Analog Tuning (the $F_{VCO}$ is Controlled by the PLL Unit 2) (Step S228)

The PLL unit 2 changes the control voltage Vtune of the VCO unit 1 to make the VCO frequency $f_{VCO}$ convergent to the frequency provided as the frequency dividing ratio setting signal input in step S201. The entire procedure is terminated when the VCO frequency $f_{VCO}$ converges.

Figure 12:
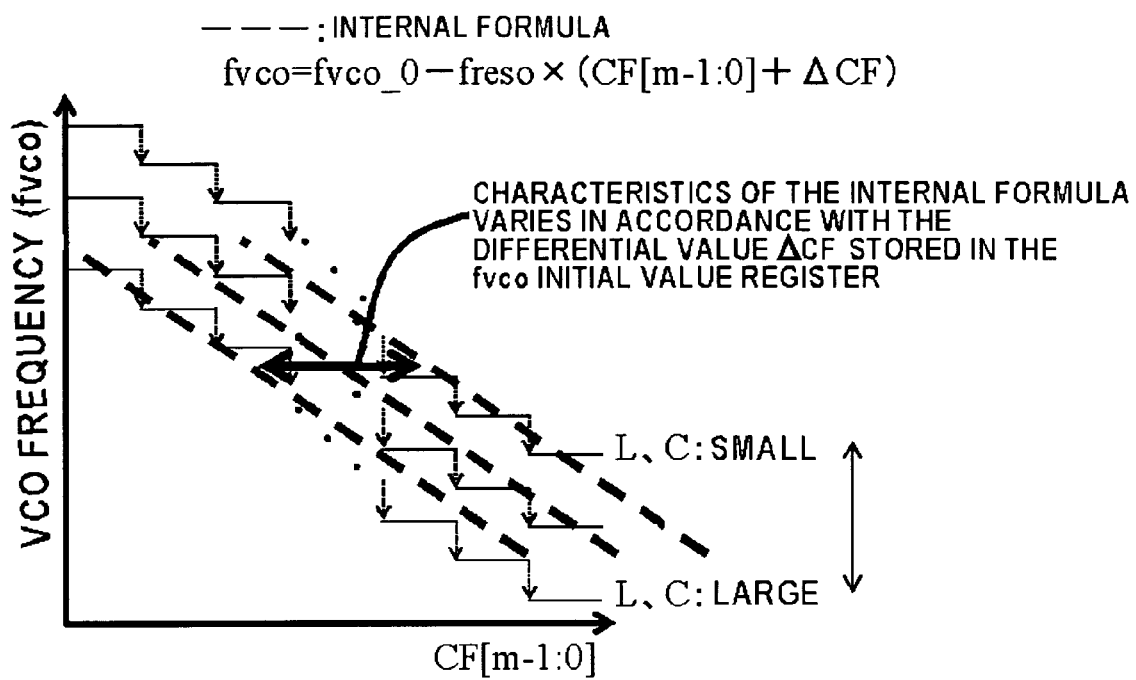
FIG. 12 shows the relationship between the selection signal CF[m-1:0] of the VCO unit and the VCO frequency $f_{VCO}$, and the internal ideal formula of the embodiment according to the present invention.
Figure 13:
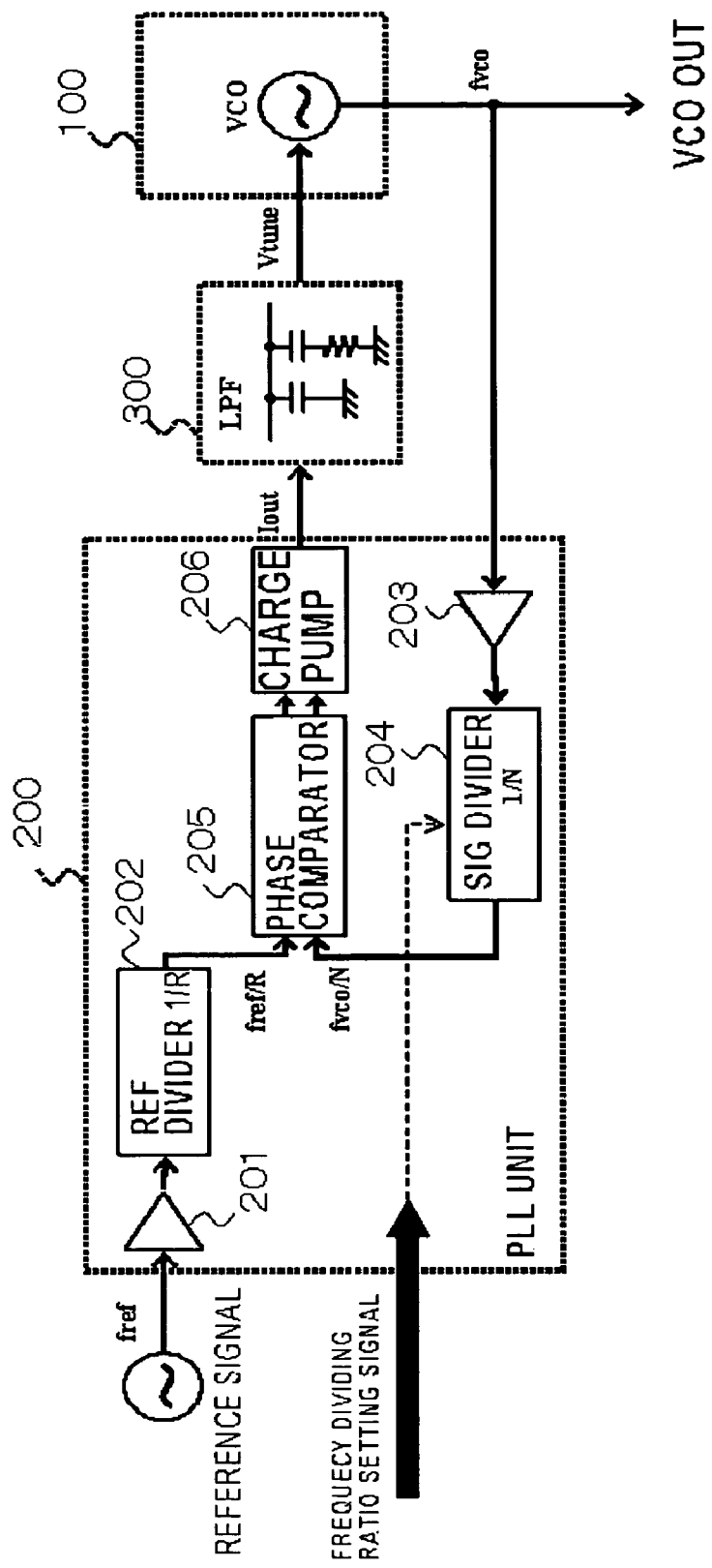
FIG. 13 shows an example of a conventional PLL frequency synthesizer.
Figure 14:
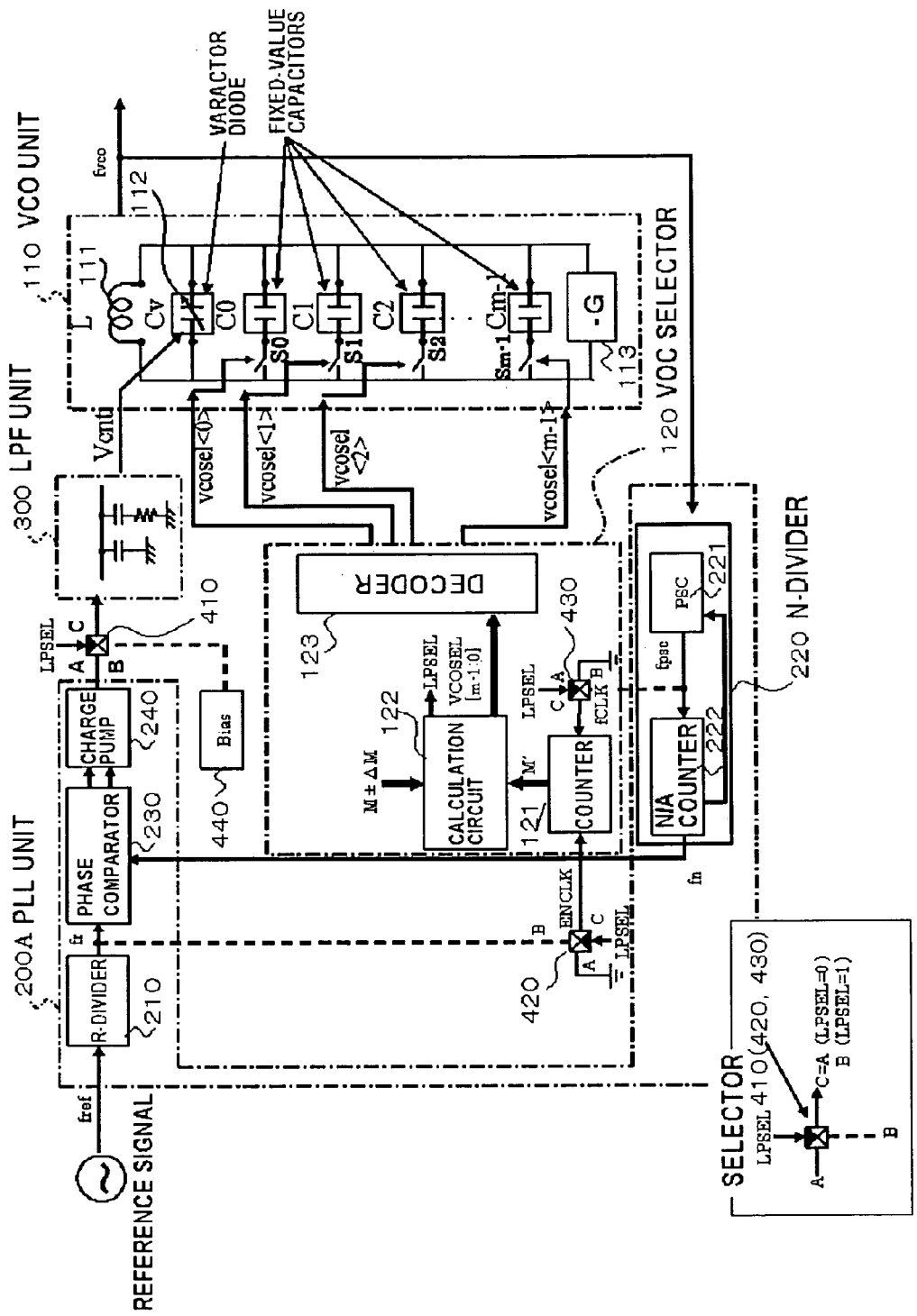
FIG. 14 shows another example of a conventional PLL frequency synthesizer.
Figure 15:
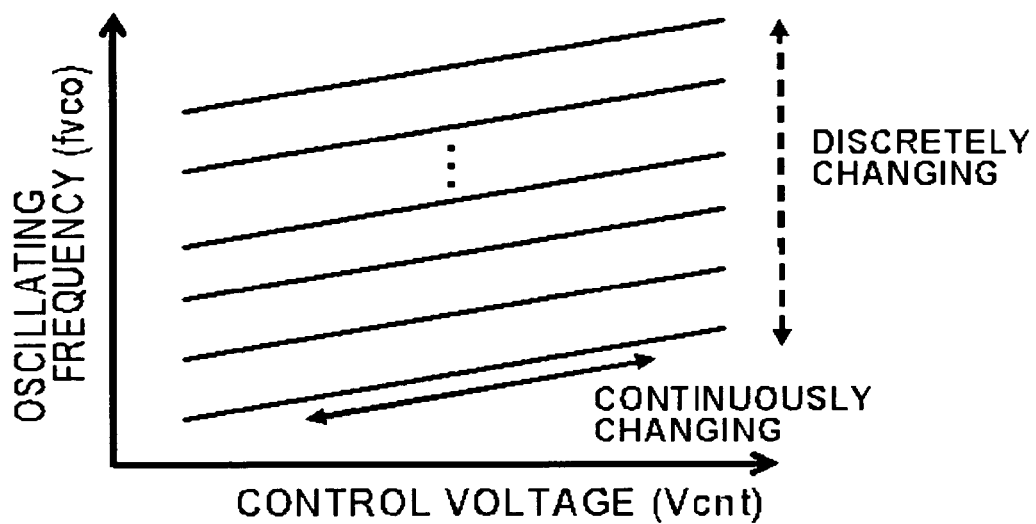
FIG. 15 shows a relationship between the control voltage and the output frequency (Vcnt–$f_{VCO}$ characteristics) of the VCO unit shown in FIG. 14.
Figure 16:
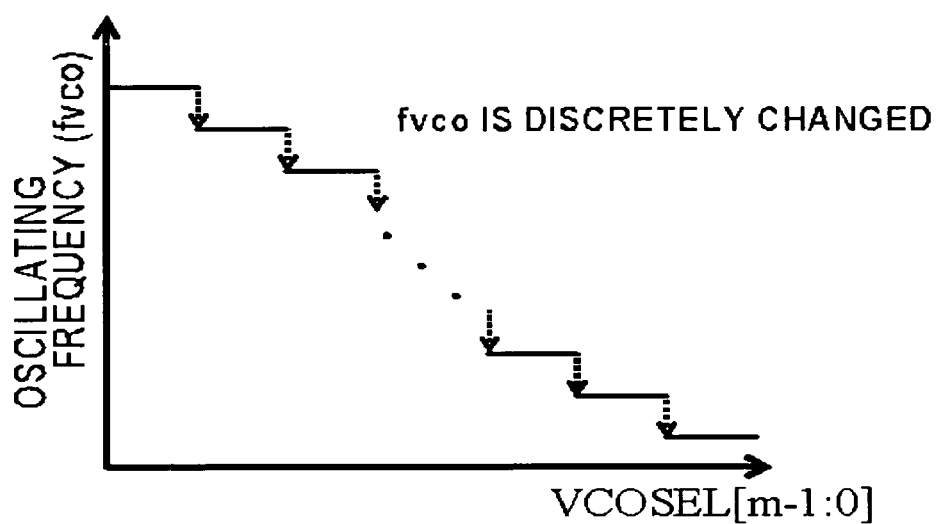
FIG. 16 shows a relationship between the selection signal VCOSEL[m-1:0] and the oscillating frequency ($f_{VCO}$).

Thus, as shown in FIG. 12, the characteristics of the internal formula varies in accordance with the differential value ΔCF stored in the $f_{VCO}$ initial value register 36.

With the PLL frequency synthesizer of the second embodiment, the following merits are obtained in addition to those of the first embodiment.

The initial value "CF_0" of the selection signal CF[m-1:0] close to the expected value of the $f_{VCO}$ can be obtained by using the differential value "ΔCF" between the internal ideal formula and the actual characteristics of the $f_{VCO}$. As the initial value "CF_0" of the selection signal CF[m-1:0] close to the expected value thereof is obtained, it is possible to reduce the judging time.

Therefore, in this embodiment, it is possible to prevent increase of the number or the time for the judging even when the variations of the inductor (L) and the capacitor (C) generated in the manufacturing process cause variations of the characteristics of the VCO frequency $f_{VCO}$ for the same selection signal CF[m-1:0].

Although the present invention has been described referring to the preferable embodiment, it is apparent to those skilled in the art that the embodiment is only exemplary, and that various modifications may be made without departing from the scope of the present invention.

For example, the number of fixed-value capacitors included in each of the group of fixed-value capacitors 12 may be arbitrary set, and a bit length of the selection signal CF[m-1:0] may also be arbitrary set.

The PLL frequency synthesizer according to the present invention is applicable widely in a mobile-phone and various radio communication equipments with multiple sent and received frequencies.

What is claimed is:

1. A phase locked loop frequency synthesizer, comprising:
   an LC-tank circuit which includes an inductor and a variable capacitor in which a capacitance changes depending on an input voltage;
   a group of fixed-value capacitors which are selectively connected to said LC-tank circuit in parallel;
   a voltage controlled oscillating unit which outputs a signal with a frequency determined by said LC-tank circuit and said group of fixed-value capacitors;
   a phase control unit which generates an output current based on an error operator between a first signal with a divided frequency of a reference frequency and a second signal with a divided frequency of said frequency output from said voltage controlled oscillating unit;
   a fixed-value capacitor controlling unit which outputs a selection signal which determines a combination of said fixed-value capacitors to be connected to said LC-tank circuit based on a frequency dividing ratio setting signal including information about a dividing ratio of said second signal, and controls the connection of said fixed-value capacitors selected from said group of fixed-value capacitors based on said selection signal; and
   a variable capacitor controlling unit which selects either one of a fixed bias voltage and a voltage obtained by converting said output current output from said phase control unit and inputs the selected voltage to said variable capacitor of said LC-tank circuit,
   wherein said fixed-value capacitor controlling unit includes:
     a first counter which counts said first signal;
     a second counter which counts a count number of said second signal while said first counter counts predetermined numbers of said first signal;
     a calculation unit that calculates an ideal value for said count number of said second signal while said predetermined numbers of said first signal is counted; and
     a comparator which compares said count number counted by said second counter and said ideal value and outputs a differential operator thereof,
     said fixed-value capacitor controlling unit correcting said selection signal based on said differential operator.

2. The phase locked loop frequency synthesizer as set forth in claim 1, wherein said fixed-value capacitor controlling unit is operated to change the selection signal to determine an optimal selection signal while said variable capacitor controlling unit selects said fixed bias voltage, and said variable capacitor controlling unit is operated to select said voltage obtained by converting said output current output from said phase control unit while said fixed-value capacitor controlling unit is fixed to output said optimal selection signal.

3. The phase locked loop frequency synthesizer as set forth in claim 2, wherein said fixed-value capacitor controlling unit determines an initial value of said selection signal based on said frequency dividing ratio setting signal.

4. The phase locked loop frequency synthesizer as set forth in claim 2, wherein said fixed-value capacitor controlling unit includes a count number setting unit which accepts a setting of a judgment accuracy of said fixed-value capacitor controlling unit and sets said predetermined numbers of said first signal based on said judgment accuracy.

5. The phase locked loop frequency synthesizer as set forth in claim 2, wherein said fixed-value capacitor controlling unit includes a memory unit which stores said differential operator obtained by said comparator when said selection signal is determined based on a center of frequency of a used frequency bandwidth, as an initial differential operator,
   wherein said fixed-value capacitor controlling unit determines an initial value of said selection signal based on said initial differential operator when said initial differential operator is stored in said memory unit.

6. The phase locked loop frequency synthesizer as set forth in claim 1, wherein said fixed-value capacitor controlling unit determines an initial value of said selection signal based on said frequency dividing ratio setting signal.

7. The phase locked loop frequency synthesizer as set forth in claim 6, wherein said fixed-value capacitor controlling unit includes a count number setting unit which accepts a setting of a judgment accuracy of said fixed-value capacitor controlling unit and sets said predetermined numbers of said first signal based on said judgment accuracy.

8. The phase locked loop frequency synthesizer as set forth in claim 6, wherein said fixed-value capacitor controlling unit includes a memory unit which stores said differential operator obtained by said comparator when said selection signal is determined based on a center of frequency of a used frequency bandwidth, as an initial differential operator,
   wherein said fixed-value capacitor controlling unit determines an initial value of said selection signal based on said initial differential operator when said initial differential operator is stored in said memory unit.

9. The phase locked loop frequency synthesizer as set forth in claim 1, wherein said fixed-value capacitor controlling unit includes a count number setting unit which accepts a setting of a judgment accuracy of said fixed-value capacitor controlling unit and sets said predetermined numbers of said first signal based on said judgment accuracy.

10. The phase locked loop frequency synthesizer as set forth in claim 9, wherein said fixed-value capacitor controlling unit includes a memory unit which stores said differential operator obtained by said comparator when said selection signal is determined based on a center of frequency of a used frequency bandwidth, as an initial differential operator,
    wherein said fixed-value capacitor controlling unit determines an initial value of said selection signal based on said initial differential operator when said initial differential operator is stored in said memory unit.

11. The phase locked loop frequency synthesizer as set forth in claim 9, wherein said fixed-value capacitor controlling unit includes a judging unit which judges whether said differential operator output from said comparator is within a predetermined convergence range,
    wherein said fixed-value capacitor controlling unit outputs a termination signal indicating a termination of the a process of said fixed-value capacitor controlling unit.

12. The phase locked loop frequency synthesizer as set forth in claim 1, wherein said fixed-value capacitor controlling unit includes a memory unit which stores said differential operator obtained by said comparator when said selection signal is determined based on a center of frequency of a used frequency bandwidth, as an initial differential operator,
 wherein said fixed-value capacitor controlling unit determines an initial value of said selection signal based on said initial differential operator when said initial differential operator is stored in said memory unit.

13. The phase locked loop frequency synthesizer as set forth in claim 12, wherein said fixed-value capacitor controlling unit includes a judging unit which judges whether said differential operator output from said comparator is within a predetermined convergence range,
 wherein said fixed-value capacitor controlling unit outputs a termination signal indicating a termination of a process of said fixed-value capacitor controlling unit.

14. A fixed-value capacitor controlling unit for a phase locked loop frequency synthesizer, said fixed-value capacitor controlling unit comprising:
 a first counter which counts a first signal representing a reference frequency;
 a second counter which counts, while said first counter counts predetermined numbers of said first signal, a second signal representing a frequency output by an oscillating unit of said phase locked loop frequency synthesizer;
 a calculation unit that calculates an ideal value for said count number of said second signal; and
 a comparator which compares said count number counted by said second counter and said ideal value to output a differential operator thereof,
 said fixed-value capacitor controlling unit providing, based on said differential operator, a selection signal which determines a combination of fixed-value capacitors to be connected to an LC-tank circuit of said phase locked loop frequency synthesizer.

15. The fixed-value capacitor controlling unit as set forth in claim 14, wherein said fixed-value capacitor controlling unit determines an initial value of said selection signal based on a frequency dividing ratio setting signal.

16. The fixed-value capacitor controlling unit as set forth in claim 14, wherein said fixed-value capacitor controlling unit includes a count number setting unit which accepts a setting of a judgment accuracy of said fixed-value capacitor controlling unit and sets a size of said predetermined numbers of said first signal based on said judgment accuracy.

17. The fixed-value capacitor controlling unit as set forth in claim 14, further comprising a memory unit which stores said differential operator obtained by said comparator when said selection signal is determined based on a center of frequency of a used frequency bandwidth, as an initial differential operator,
 wherein said fixed-value capacitor controlling unit determines an initial value of said selection signal based on said initial differential operator when said initial differential operator is stored in said memory unit.

18. A phase locked loop frequency synthesizer, comprising:
 a fixed-value capacitor controlling unit comprising:
  a first counter which counts a first signal representing a reference frequency;
  a second counter which counts a second signal representing a frequency output by an oscillating unit of said phase locked loop frequency synthesizer;
  a calculation unit that calculates an ideal value for said count number of said second signal; and
  a comparator which compares said count number counted by said second counter and said ideal value to output a differential operator thereof,
 said fixed-value capacitor controlling unit correcting, based on said differential operator to output to voltage control oscillating, a selection signal which determines a combination of fixed-value capacitors to be connected to an LC-tank circuit of said phase locked loop frequency synthesizer.

* * * * *